(12) United States Patent
Kliner et al.

(10) Patent No.: US 10,295,845 B2
(45) Date of Patent: May 21, 2019

(54) ADJUSTABLE BEAM CHARACTERISTICS

(71) Applicant: nLIGHT, Inc., Vancouver, WA (US)

(72) Inventors: Dahv A. V. Kliner, Portland, OR (US); Roger Farrow, Vancouver, WA (US)

(73) Assignee: nLIGHT, Inc., Vancouver, WA (US)

( * ) Notice: Subject to any disclaimer, the term of this patent is extended or adjusted under 35 U.S.C. 154(b) by 0 days.

(21) Appl. No.: 15/607,411

(22) Filed: May 26, 2017

(65) Prior Publication Data

US 2018/0088358 A1 Mar. 29, 2018

Related U.S. Application Data

(60) Provisional application No. 62/401,650, filed on Sep. 29, 2016.

(51) Int. Cl.
*G02B 6/02* (2006.01)
*G02B 6/24* (2006.01)
(Continued)

(52) U.S. Cl.
CPC .......... *G02F 1/0115* (2013.01); *B22F 3/1055* (2013.01); *B22F 3/1109* (2013.01);
(Continued)

(58) Field of Classification Search
None
See application file for complete search history.

(56) References Cited

U.S. PATENT DOCUMENTS 3,388,461 A 6/1968 Lins
4,138,190 A 2/1979 Bryngdahl
(Continued)

FOREIGN PATENT DOCUMENTS

CA 2637535 8/2007
DE 4200587 4/1993
(Continued)

OTHER PUBLICATIONS

"ARM," Coherent, available at: http://www.corelase.fi/products/arm/, 6 pages, retrieved May 26, 2017.
(Continued)

*Primary Examiner* — Michelle R Connelly
(74) *Attorney, Agent, or Firm* — Klarquist Sparkman, LLP

(57) ABSTRACT

Disclosed herein are methods, apparatus, and systems for providing an optical beam delivery system, comprising an optical fiber including a first length of fiber comprising a first RIP formed to enable, at least in part, modification of one or more beam characteristics of an optical beam by a perturbation assembly arranged to modify the one or more beam characteristics, the perturbation assembly coupled to the first length of fiber or integral with the first length of fiber, or a combination thereof and a second length of fiber coupled to the first length of fiber and having a second RIP formed to preserve at least a portion of the one or more beam characteristics of the optical beam modified by the perturbation assembly within one or more first confinement regions. The optical beam delivery system may include an optical system coupled to the second length of fiber including one or more free-space optics configured to receive and transmit an optical beam comprising the modified one or more beam characteristics.

27 Claims, 12 Drawing Sheets

(51) Int. Cl.

| | | |
|---|---|---|
| *G02F 1/01* | (2006.01) | |
| *B23K 26/064* | (2014.01) | |
| *B23K 26/073* | (2006.01) | |
| *G02B 6/42* | (2006.01) | |
| *G02B 6/255* | (2006.01) | |
| *G02B 27/09* | (2006.01) | |
| *B23K 26/067* | (2006.01) | |
| *B23K 26/38* | (2014.01) | |
| *G02B 6/14* | (2006.01) | |
| *B23K 26/21* | (2014.01) | |
| *B22F 3/105* | (2006.01) | |
| *B22F 3/11* | (2006.01) | |
| *B22F 3/24* | (2006.01) | |
| *B23K 26/03* | (2006.01) | |
| *B33Y 10/00* | (2015.01) | |
| *B33Y 30/00* | (2015.01) | |
| *B33Y 50/02* | (2015.01) | |
| *B23K 26/342* | (2014.01) | |
| *G02B 6/26* | (2006.01) | |
| *G02B 6/12* | (2006.01) | |
| *G02F 1/015* | (2006.01) | |
| *G02B 6/028* | (2006.01) | |
| *G02B 6/036* | (2006.01) | |
| *G02B 26/10* | (2006.01) | |

(52) U.S. Cl.
CPC ............. *B22F 3/24* (2013.01); *B23K 26/032* (2013.01); *B23K 26/064* (2015.10); *B23K 26/067* (2013.01); *B23K 26/073* (2013.01); *B23K 26/21* (2015.10); *B23K 26/342* (2015.10); *B23K 26/38* (2013.01); *B33Y 10/00* (2014.12); *B33Y 30/00* (2014.12); *B33Y 50/02* (2014.12); *G02B 6/02* (2013.01); *G02B 6/14* (2013.01); *G02B 6/255* (2013.01); *G02B 6/4206* (2013.01); *G02B 27/0927* (2013.01); *G02B 27/0933* (2013.01); *G02B 27/0994* (2013.01); *B22F 2003/1056* (2013.01); *B22F 2003/1057* (2013.01); *G02B 6/02004* (2013.01); *G02B 6/0281* (2013.01); *G02B 6/0365* (2013.01); *G02B 6/03616* (2013.01); *G02B 6/03627* (2013.01); *G02B 6/03633* (2013.01); *G02B 6/03638* (2013.01); *G02B 6/03688* (2013.01); *G02B 6/262* (2013.01); *G02B 6/4296* (2013.01); *G02B 26/101* (2013.01); *G02B 2006/12121* (2013.01); *G02F 2001/0151* (2013.01)

(56) References Cited

U.S. PATENT DOCUMENTS

| | | |
|---|---|---|
| 4,252,403 A | 2/1981 | Salisbury |
| 4,266,851 A | 5/1981 | Salisbury |
| 4,475,027 A | 10/1984 | Pressley |
| 4,475,789 A | 10/1984 | Kahn |
| 4,713,518 A | 12/1987 | Yamazaki et al. |
| 4,863,538 A | 9/1989 | Deckard |
| 4,998,797 A | 3/1991 | van den Bergh et al. |
| 5,008,555 A | 4/1991 | Mundy |
| 5,153,773 A | 10/1992 | Muraki et al. |
| 5,252,991 A | 10/1993 | Storlie et al. |
| 5,319,195 A | 6/1994 | Jones et al. |
| 5,463,497 A | 10/1995 | Muraki et al. |
| 5,475,415 A | 12/1995 | Noethen |
| 5,475,704 A | 12/1995 | Lomashevich |
| 5,509,597 A | 4/1996 | Laferriere |
| 5,523,543 A | 6/1996 | Hunter, Jr. et al. |
| 5,684,642 A | 11/1997 | Zumoto et al. |
| 5,745,284 A | 4/1998 | Goldberg et al. |
| 5,748,824 A | 5/1998 | Smith |
| 5,761,234 A | 6/1998 | Craig et al. |
| 5,818,630 A | 10/1998 | Fermann et al. |
| 5,864,430 A | 1/1999 | Dickey et al. |
| 5,903,696 A | 5/1999 | Krivoshlykov |
| 5,909,306 A | 6/1999 | Goldberg et al. |
| 5,932,119 A | 8/1999 | Kaplan et al. |
| 5,986,807 A | 11/1999 | Fork |
| 5,999,548 A | 12/1999 | Mori et al. |
| 6,072,184 A | 6/2000 | Okino et al. |
| 6,132,104 A | 10/2000 | Bliss et al. |
| 6,330,382 B1 | 12/2001 | Harshbarger et al. |
| RE37,585 E | 3/2002 | Mourou et al. |
| 6,353,203 B1 | 3/2002 | Hokodate et al. |
| 6,362,004 B1 | 3/2002 | Noblett |
| 6,426,840 B1 | 7/2002 | Partanen et al. |
| 6,433,301 B1 | 8/2002 | Dunsky et al. |
| 6,434,177 B1 | 8/2002 | Jurgensen |
| 6,483,973 B1 | 11/2002 | Mazzarese et al. |
| 6,490,376 B1 | 12/2002 | Au et al. |
| 6,496,301 B1 | 12/2002 | Koplow et al. |
| 6,542,665 B2 | 4/2003 | Reed et al. |
| 6,556,340 B1 | 4/2003 | Wysocki et al. |
| 6,577,314 B1 | 6/2003 | Yoshida et al. |
| 6,639,177 B2 | 10/2003 | Ehrmann et al. |
| 6,671,293 B2 | 12/2003 | Kopp et al. |
| 6,711,918 B1 | 3/2004 | Kliner et al. |
| 6,724,528 B2 | 4/2004 | Koplow et al. |
| 6,772,611 B2 | 8/2004 | Kliner et al. |
| 6,777,645 B2 | 8/2004 | Ehrmann et al. |
| 6,779,364 B2 | 8/2004 | Tankala et al. |
| 6,801,550 B1 | 10/2004 | Snell et al. |
| 6,819,815 B1 | 11/2004 | Corbalis et al. |
| 6,825,974 B2 | 11/2004 | Kliner et al. |
| 6,839,163 B1 | 1/2005 | Jakobson et al. |
| 6,882,786 B1 | 4/2005 | Kliner et al. |
| 6,895,154 B2 * | 5/2005 | Johnson .................. B82Y 20/00 385/123 |
| 6,917,742 B2 | 7/2005 | Po |
| 6,941,053 B2 | 9/2005 | Lauzon et al. |
| 6,963,062 B2 | 11/2005 | Cyr et al. |
| 6,989,508 B2 | 1/2006 | Ehrmann et al. |
| 7,068,900 B2 | 6/2006 | Croteau et al. |
| 7,079,566 B2 | 7/2006 | Kido et al. |
| 7,099,533 B1 | 8/2006 | Chenard |
| 7,116,887 B2 | 10/2006 | Farroni et al. |
| 7,146,073 B2 | 12/2006 | Wan |
| 7,148,447 B2 | 12/2006 | Ehrmann et al. |
| 7,151,787 B2 | 12/2006 | Kulp et al. |
| 7,151,788 B2 | 12/2006 | Imakado et al. |
| 7,157,661 B2 | 1/2007 | Amako |
| 7,170,913 B2 | 1/2007 | Araujo et al. |
| 7,184,630 B2 | 2/2007 | Kwon et al. |
| 7,193,771 B1 | 3/2007 | Smith et al. |
| 7,235,150 B2 | 6/2007 | Bischel et al. |
| 7,257,293 B1 | 8/2007 | Fini et al. |
| 7,317,857 B2 | 1/2008 | Manyam et al. |
| 7,349,123 B2 | 3/2008 | Clarke et al. |
| 7,359,604 B2 | 4/2008 | Po |
| 7,373,070 B2 | 5/2008 | Wetter et al. |
| 7,382,389 B2 | 6/2008 | Cordingley et al. |
| 7,394,476 B2 | 7/2008 | Cordingley et al. |
| 7,421,175 B2 | 9/2008 | Varnham |
| 7,463,805 B2 | 12/2008 | Li et al. |
| 7,526,166 B2 | 4/2009 | Bookbinder et al. |
| 7,527,977 B1 | 5/2009 | Fruetel et al. |
| 7,537,395 B2 | 5/2009 | Savage-Leuchs |
| 7,592,568 B2 | 9/2009 | Varnham et al. |
| 7,593,435 B2 | 9/2009 | Gapontsev et al. |
| 7,748,913 B2 | 7/2010 | Oba |
| 7,764,854 B2 | 7/2010 | Fini |
| 7,781,778 B2 | 8/2010 | Moon et al. |
| 7,783,149 B2 | 8/2010 | Fini |
| 7,835,608 B2 * | 11/2010 | Minelly .................. G02B 6/03638 385/126 |
| 7,839,901 B2 | 11/2010 | Meleshkevich et al. |
| 7,876,495 B1 | 1/2011 | Minelly |
| 7,880,961 B1 | 2/2011 | Feve et al. |
| 7,920,767 B2 | 4/2011 | Fini |

(56) References Cited

U.S. PATENT DOCUMENTS

| | | |
|---|---|---|
| 7,924,500 B1 | 4/2011 | Minelly |
| 7,925,125 B2 | 4/2011 | Cyr et al. |
| 7,955,905 B2 | 6/2011 | Cordingley et al. |
| 7,955,906 B2 | 6/2011 | Cordingley et al. |
| 8,027,555 B1 | 9/2011 | Kliner et al. |
| 8,071,912 B2 | 12/2011 | Costin, Sr. et al. |
| 8,217,304 B2 | 7/2012 | Cordingley et al. |
| 8,237,788 B2 | 8/2012 | Cooper et al. |
| 8,243,764 B2 | 8/2012 | Tucker et al. |
| 8,251,475 B2 | 8/2012 | Murray et al. |
| 8,269,108 B2 | 9/2012 | Kunishi et al. |
| 8,270,441 B2 | 9/2012 | Rogers et al. |
| 8,270,445 B2 | 9/2012 | Morasse et al. |
| 8,278,591 B2 | 10/2012 | Chouf et al. |
| 8,288,679 B2 | 10/2012 | Unrath |
| 8,288,683 B2 | 10/2012 | Jennings et al. |
| 8,310,009 B2 | 11/2012 | Saran et al. |
| 8,317,413 B2 | 11/2012 | Fisher et al. |
| 8,362,391 B2 | 1/2013 | Partlo et al. |
| 8,395,084 B2 | 3/2013 | Tanaka |
| 8,404,998 B2 | 3/2013 | Unrath et al. |
| 8,411,710 B2 | 4/2013 | Tamaoki |
| 8,414,264 B2 | 4/2013 | Bolms et al. |
| 8,433,161 B2 | 4/2013 | Langseth et al. |
| 8,442,303 B2 | 5/2013 | Cheng et al. |
| 8,472,099 B2 | 6/2013 | Fujino et al. |
| 8,509,577 B2 | 8/2013 | Liu |
| 8,526,110 B1 | 9/2013 | Honea et al. |
| 8,537,871 B2 | 9/2013 | Saracco |
| 8,542,145 B2 | 9/2013 | Galati |
| 8,542,971 B2 | 9/2013 | Chatigny |
| 8,593,725 B2 | 11/2013 | Kliner et al. |
| 8,711,471 B2 | 4/2014 | Liu et al. |
| 8,728,591 B2 | 5/2014 | Inada et al. |
| 8,755,649 B2 | 6/2014 | Yilmaz et al. |
| 8,755,660 B1 | 6/2014 | Minelly |
| 8,774,237 B2 | 7/2014 | Maryashin et al. |
| 8,781,269 B2 | 7/2014 | Huber et al. |
| 8,809,734 B2 | 8/2014 | Cordingley et al. |
| 8,835,804 B2 | 9/2014 | Farmer et al. |
| 8,861,910 B2 | 10/2014 | Yun |
| 8,873,134 B2 | 10/2014 | Price et al. |
| 8,947,768 B2 | 2/2015 | Kliner et al. |
| 8,948,218 B2 | 2/2015 | Gapontsev et al. |
| 8,953,914 B2 | 2/2015 | Genier |
| 9,014,220 B2 | 4/2015 | Minelly et al. |
| 9,136,663 B2 | 9/2015 | Taya |
| 9,140,873 B2 | 9/2015 | Minelly |
| 9,158,066 B2 | 10/2015 | Fini et al. |
| 9,170,359 B2 | 10/2015 | Van Bommel et al. |
| 9,207,395 B2 | 12/2015 | Fini et al. |
| 9,217,825 B2 | 12/2015 | Ye et al. |
| 9,250,390 B2 * | 2/2016 | Muendel ............... G02B 6/32 |
| 9,310,560 B2 | 4/2016 | Chann et al. |
| 9,322,989 B2 | 4/2016 | Fini et al. |
| 9,325,151 B1 | 4/2016 | Fini et al. |
| 9,339,890 B2 | 5/2016 | Woods et al. |
| 9,366,887 B2 | 6/2016 | Tayebati et al. |
| 9,397,466 B2 | 7/2016 | McComb et al. |
| 9,431,786 B2 * | 8/2016 | Savage-Leuchs ........................... G02B 6/02347 |
| 9,442,252 B2 | 9/2016 | Genier |
| 9,482,821 B2 | 11/2016 | Huber et al. |
| 9,507,084 B2 | 11/2016 | Fini et al. |
| 9,537,042 B2 | 1/2017 | Dittli et al. |
| 9,547,121 B2 | 1/2017 | Hou et al. |
| 9,634,462 B2 | 4/2017 | Kliner et al. |
| 9,837,783 B2 | 12/2017 | Kliner et al. |
| 2001/0050364 A1 | 12/2001 | Tanaka et al. |
| 2002/0097963 A1 | 7/2002 | Ukechi et al. |
| 2002/0146202 A1 | 10/2002 | Reed et al. |
| 2002/0158052 A1 | 10/2002 | Ehrmann et al. |
| 2002/0159685 A1 | 10/2002 | Cormack |
| 2002/0168139 A1 | 11/2002 | Clarkson et al. |
| 2002/0176676 A1 * | 11/2002 | Johnson ............... B82Y 20/00 385/125 |
| 2003/0031407 A1 * | 2/2003 | Weisberg ............... G02B 6/023 385/28 |
| 2003/0032204 A1 | 2/2003 | Walt et al. |
| 2003/0043384 A1 | 3/2003 | Hill |
| 2003/0059184 A1 | 3/2003 | Tankala et al. |
| 2003/0095578 A1 | 5/2003 | Kopp et al. |
| 2003/0118305 A1 | 6/2003 | Reed et al. |
| 2003/0213998 A1 | 11/2003 | Hsu et al. |
| 2003/0219208 A1 | 11/2003 | Kwon et al. |
| 2004/0013379 A1 * | 1/2004 | Johnson ............... B82Y 20/00 385/125 |
| 2004/0086245 A1 | 5/2004 | Farroni et al. |
| 2004/0112634 A1 | 6/2004 | Tanaka et al. |
| 2004/0207936 A1 | 10/2004 | Yamamoto et al. |
| 2004/0208464 A1 | 10/2004 | Po |
| 2005/0002607 A1 | 1/2005 | Neuhaus et al. |
| 2005/0027288 A1 | 2/2005 | Oyagi et al. |
| 2005/0041697 A1 | 2/2005 | Seifert et al. |
| 2005/0168847 A1 | 8/2005 | Sasaki |
| 2005/0185892 A1 | 8/2005 | Kwon et al. |
| 2005/0233557 A1 | 10/2005 | Tanaka et al. |
| 2005/0259944 A1 * | 11/2005 | Anderson ........ B29D 11/00721 385/147 |
| 2005/0265678 A1 | 12/2005 | Manyam et al. |
| 2005/0271340 A1 * | 12/2005 | Weisberg ............ G02B 6/02304 385/123 |
| 2006/0024001 A1 | 2/2006 | Kobayashi |
| 2006/0054606 A1 | 3/2006 | Amako |
| 2006/0067632 A1 * | 3/2006 | Broeng ............... G02B 6/02328 385/96 |
| 2006/0219673 A1 | 10/2006 | Varnham et al. |
| 2006/0275705 A1 | 12/2006 | Dorogy et al. |
| 2006/0291788 A1 | 12/2006 | Po |
| 2007/0075060 A1 | 4/2007 | Shedlov et al. |
| 2007/0104436 A1 | 5/2007 | Li et al. |
| 2007/0104438 A1 | 5/2007 | Varnham |
| 2007/0147751 A1 | 6/2007 | Fini |
| 2007/0178674 A1 | 8/2007 | Imai et al. |
| 2007/0195850 A1 | 8/2007 | Schluter et al. |
| 2007/0215820 A1 | 9/2007 | Cordingley et al. |
| 2008/0037604 A1 | 2/2008 | Savage-Leuchs |
| 2008/0141724 A1 * | 6/2008 | Fuflyigin ............ C03B 37/0183 65/391 |
| 2008/0181567 A1 | 7/2008 | Bookbinder et al. |
| 2008/0246024 A1 | 10/2008 | Touwslager et al. |
| 2009/0034059 A1 | 2/2009 | Fini |
| 2009/0059353 A1 | 3/2009 | Fini |
| 2009/0080835 A1 | 3/2009 | Frith |
| 2009/0122377 A1 | 5/2009 | Wagner |
| 2009/0127477 A1 | 5/2009 | Tanaka et al. |
| 2009/0129237 A1 | 5/2009 | Chen et al. |
| 2009/0152247 A1 | 6/2009 | Jennings et al. |
| 2009/0154512 A1 | 6/2009 | Simons et al. |
| 2009/0175301 A1 | 7/2009 | Li et al. |
| 2009/0274833 A1 | 11/2009 | Li |
| 2009/0297108 A1 | 12/2009 | Ushiwata et al. |
| 2009/0314752 A1 | 12/2009 | Manens et al. |
| 2010/0025387 A1 | 2/2010 | Arai et al. |
| 2010/0067013 A1 * | 3/2010 | Howieson ............ G01N 21/3504 356/437 |
| 2010/0067860 A1 | 3/2010 | Ikeda et al. |
| 2010/0129029 A1 * | 5/2010 | Westbrook ........... G02B 6/02095 385/28 |
| 2010/0150186 A1 | 6/2010 | Mizuuchi |
| 2010/0163537 A1 | 7/2010 | Furuta et al. |
| 2010/0187409 A1 | 7/2010 | Cristiani et al. |
| 2010/0225974 A1 | 9/2010 | Sandstrom |
| 2010/0230665 A1 | 9/2010 | Verschuren et al. |
| 2011/0058250 A1 | 3/2011 | Liu et al. |
| 2011/0080476 A1 | 4/2011 | Dinauer et al. |
| 2011/0091155 A1 | 4/2011 | Yilmaz et al. |
| 2011/0127697 A1 | 6/2011 | Milne |
| 2011/0133365 A1 | 6/2011 | Ushimaru et al. |
| 2011/0163077 A1 | 7/2011 | Partlo et al. |
| 2011/0187025 A1 | 8/2011 | Costin, Sr. |
| 2011/0248005 A1 | 10/2011 | Briand et al. |

(56) References Cited

U.S. PATENT DOCUMENTS

| | | | |
|---|---|---|---|
| 2011/0278277 A1 | 11/2011 | Stork Genannt Wersborg | |
| 2011/0279826 A1 | 11/2011 | Miura et al. | |
| 2011/0297229 A1 | 12/2011 | Gu et al. | |
| 2011/0305249 A1 | 12/2011 | Gapontsev et al. | |
| 2011/0305256 A1 | 12/2011 | Chann | |
| 2012/0002919 A1 | 1/2012 | Liu | |
| 2012/0051084 A1 | 3/2012 | Yalin et al. | |
| 2012/0051692 A1 | 3/2012 | Seo | |
| 2012/0082410 A1 | 4/2012 | Peng et al. | |
| 2012/0127097 A1 | 5/2012 | Gaynor et al. | |
| 2012/0145685 A1 | 6/2012 | Ream et al. | |
| 2012/0148823 A1 | 6/2012 | Chu | |
| 2012/0156458 A1 | 6/2012 | Chu | |
| 2012/0168411 A1 | 7/2012 | Farmer et al. | |
| 2012/0262781 A1 | 10/2012 | Price et al. | |
| 2012/0295071 A1 | 11/2012 | Sato | |
| 2012/0301733 A1 | 11/2012 | Eckert et al. | |
| 2012/0301737 A1 | 11/2012 | Labelle et al. | |
| 2012/0321262 A1* | 12/2012 | Goell | A61B 1/018 385/123 |
| 2012/0329974 A1 | 12/2012 | Inada et al. | |
| 2013/0005139 A1 | 1/2013 | Krasnov et al. | |
| 2013/0022754 A1 | 1/2013 | Bennett et al. | |
| 2013/0023086 A1 | 1/2013 | Chikama et al. | |
| 2013/0027648 A1 | 1/2013 | Moriwaki | |
| 2013/0038923 A1* | 2/2013 | Jespersen | G02B 6/4296 359/337.5 |
| 2013/0087694 A1 | 4/2013 | Creeden et al. | |
| 2013/0095260 A1 | 4/2013 | Bovatsek et al. | |
| 2013/0146569 A1 | 6/2013 | Woods et al. | |
| 2013/0148925 A1* | 6/2013 | Muendel | G02B 6/32 385/27 |
| 2013/0223792 A1 | 8/2013 | Huber et al. | |
| 2013/0228442 A1 | 9/2013 | Mohaptatra et al. | |
| 2013/0251324 A1 | 9/2013 | Fini et al. | |
| 2013/0272657 A1 | 10/2013 | Salokatve | |
| 2013/0299468 A1 | 11/2013 | Unrath et al. | |
| 2013/0308661 A1 | 11/2013 | Nishimura et al. | |
| 2013/0343703 A1 | 12/2013 | Genier | |
| 2014/0044143 A1 | 2/2014 | Clarkson et al. | |
| 2014/0086526 A1 | 3/2014 | Starodubov et al. | |
| 2014/0104618 A1 | 4/2014 | Potsaid et al. | |
| 2014/0155873 A1 | 6/2014 | Bor | |
| 2014/0177038 A1* | 6/2014 | Rrataj | H01S 3/10015 359/341.1 |
| 2014/0178023 A1* | 6/2014 | Oh | G02B 6/02328 385/125 |
| 2014/0205236 A1 | 7/2014 | Noguchi et al. | |
| 2014/0233900 A1 | 8/2014 | Hugonnot et al. | |
| 2014/0241385 A1 | 8/2014 | Fomin et al. | |
| 2014/0268310 A1 | 9/2014 | Ye et al. | |
| 2014/0313516 A1 | 10/2014 | Liao | |
| 2014/0319381 A1 | 10/2014 | Gross | |
| 2014/0332254 A1 | 11/2014 | Pellerite et al. | |
| 2014/0333931 A1 | 11/2014 | Lu et al. | |
| 2014/0334788 A1 | 11/2014 | Fini et al. | |
| 2015/0049987 A1 | 2/2015 | Grasso et al. | |
| 2015/0104139 A1 | 4/2015 | Brunet et al. | |
| 2015/0125114 A1 | 5/2015 | Genier | |
| 2015/0125115 A1 | 5/2015 | Genier | |
| 2015/0138630 A1 | 5/2015 | Honea et al. | |
| 2015/0165556 A1 | 6/2015 | Jones et al. | |
| 2015/0217402 A1 | 8/2015 | Hesse et al. | |
| 2015/0241632 A1 | 8/2015 | Chann et al. | |
| 2015/0293300 A1 | 10/2015 | Fini et al. | |
| 2015/0293306 A1 | 10/2015 | Huber et al. | |
| 2015/0314612 A1 | 11/2015 | Balasini et al. | |
| 2015/0316716 A1 | 11/2015 | Fini et al. | |
| 2015/0331205 A1 | 11/2015 | Tayebati et al. | |
| 2015/0349481 A1 | 12/2015 | Kliner | |
| 2015/0352664 A1 | 12/2015 | Errico et al. | |
| 2015/0372445 A1 | 12/2015 | Harter | |
| 2015/0378184 A1 | 12/2015 | Tayebati et al. | |
| 2016/0013607 A1 | 1/2016 | McComb et al. | |
| 2016/0097903 A1* | 4/2016 | Li | G02B 6/43 385/50 |
| 2016/0104995 A1 | 4/2016 | Savage-Leuchs | |
| 2016/0116679 A1* | 4/2016 | Muendel | G02B 6/32 385/11 |
| 2016/0158889 A1 | 6/2016 | Carter et al. | |
| 2016/0187646 A1 | 6/2016 | Ehrmann | |
| 2016/0218476 A1 | 7/2016 | Kliner et al. | |
| 2016/0285227 A1 | 9/2016 | Farrow et al. | |
| 2016/0320565 A1 | 11/2016 | Brown et al. | |
| 2016/0320685 A1 | 11/2016 | Tayebati et al. | |
| 2017/0003461 A1 | 1/2017 | Tayebati et al. | |
| 2017/0090119 A1* | 3/2017 | Logan | G02B 6/2555 |
| 2017/0110845 A1 | 4/2017 | Hou et al. | |
| 2017/0162999 A1 | 6/2017 | Saracco et al. | |
| 2017/0271837 A1 | 9/2017 | Hemenway et al. | |
| 2017/0293084 A1 | 10/2017 | Zhou et al. | |
| 2017/0336580 A1* | 11/2017 | Tayebati | G02B 6/4206 |
| 2017/0363810 A1 | 12/2017 | Holland et al. | |
| 2018/0059343 A1 | 3/2018 | Kliner | |
| 2018/0203185 A1 | 7/2018 | Farrow et al. | |

FOREIGN PATENT DOCUMENTS

| | | |
|---|---|---|
| DE | 10321102 | 12/2004 |
| EP | 1266259 | 5/2011 |
| EP | 2587564 | 5/2013 |
| EP | 2642246 | 9/2013 |
| WO | WO 1995/011100 | 4/1995 |
| WO | WO 1995/011101 | 4/1995 |
| WO | WO 2004/027477 | 4/2004 |
| WO | WO 2009/155536 | 12/2009 |
| WO | WO 2012/102655 | 8/2012 |
| WO | WO 2013/090236 | 6/2013 |
| WO | WO 2016/061657 | 4/2016 |
| WO | WO 2017/008022 | 1/2017 |
| WO | WO 2017/136831 | 8/2017 |

OTHER PUBLICATIONS

"Efficient and Simple Precision, Laser Processing Head PDT-B," HIGHYAG, 6 pages, (Jan. 2010).

"ENSIS Series," AMADA America, Inc., available at: http://www.amada.com/america/ensis-3015-aj, 2 pages, retrieved May 26, 2017.

"EX-F Series," MC Machinery Systems, Inc., available at: https://www.mcmachinery.com/products-and-solutions/ex-f-series/, 2 pages, retrieved May 26, 2017.

"Laser cutting machines," TRUMPF, available at: http://www.us.trumpf.com/en/products/machine-tools/products/2d-laser-cutting/innovative-technology/brightline.html, 9 pages, retrieved May 26, 2017.

Adelman et al., "Measurement of Relative State-to-State Rate Constants for the Reaction D+ $H_2(v, j) \rightarrow HD(v', j') + H$," *J. Chem. Phys*, 97:7323-7341 (Nov. 15, 1992).

Bernasconi et al., "Kinetics of Ionization of Nitromethane and Phenylnitromethane by Amines and Carboxylate Ions in $Me_2SO$-Water Mixtures. Evidence of Ammonium Ion-Nitronate Ion Hydrogen Bonded Complex Formation in $Me_2SO$-Rich Solvent Mixtures," *J. Org. Chem.*, 53:3342-3351 (1988).

Blake et al., "The H + $D_2$ Reaction: HD(v=1, J) and HD(v=2, J) Distributions at a Collision Energy of 1.3 eV," *Chem. Phys. Lett.*, 153:365-370 (Dec. 23, 1988).

Daniel et al., "Novel technique for mode selection in a large-mode-area fiber laser," Conference on Lasers and Electro-Optics 2010, OSA Technical Digest (CD) (Optical Society of America), paper CWC5, 2 pages (2010).

Daniel et al., "Novel technique for mode selection in a multimode fiber laser," *Optics Express*, 19:12434-12439 (Jun. 20, 2011).

Di Teodoro et al., "Diffraction-Limited, 300-kW Peak-Power Pulses from a Coiled Multimode Fiber Amplifier," *Optics Letters*, 27:518-520 (2002).

Di Teodoro et al., "Diffraction-limited, 300-kW-peak-power Pulses from a Yb-doped Fiber Amplifier," *Conference on Lasers and Electro-Optics*, OSA Technical Digest (Optical Society of America, Washington, DC), p. 592-593 (2002).

(56) References Cited

OTHER PUBLICATIONS

Di Teodoro et al., "High-peak-power pulsed fiber sources," *Proc. of SPIE*, 5448:561-571 (2004).
Farrow et al., "Bend-Loss Filtered, Large-Mode-Area Fiber Amplifiers: Experiments and Modeling," Proceedings of the Solid State and Diode Laser Technology Review (Directed Energy Professional Society), P-9, 5 pages (2006).
Farrow et al., "Compact Fiber Lasers for Efficient High-Power Generation," *Proc. of SPIE*, 6287:62870C-1-62870C-6 (2006).
Farrow et al., "Design of Refractive-Index and Rare-Earth-Dopant Distributions for Large-Mode-Area Fibers Used in Coiled High-Power Amplifiers," *Proc. of SPIE*, 6453:64531C-1-64531C-11 (2007).
Farrow et al., "High-Peak-Power (>1.2 MW) Pulsed Fiber Amplifier," *Proc. of the SPIE*, 6102:61020L-1-61020L-11 (2006).
Farrow et al., "Numerical Modeling of Self-Focusing Beams in Fiber Amplifiers," *Proc. of the SPIE*, 6453:645309-1-645309-9 (2007).
Farrow et al., "Peak-Power Limits on Pulsed Fiber Amplifiers Imposed by Self-Focusing," *Optics Lett.*, 31:3423-3425 (Dec. 1, 2006).
Fève et al., "Four-wave mixing in nanosecond pulsed fiber amplifiers," *Optics Express*, 15:4647-4662 (Apr. 16, 2007).
Fève et al., "Limiting Effects of Four-Wave Mixing in High-Power Pulsed Fiber Amplifiers," *Proc. of the SPIE*, 6453:64531P-1-64531P-11 (2007).
Fini, "Bend-compensated design of large-mode-area fibers," *Optics Letters*, 31:1963-1965 (Jul. 1, 2006).
Fini, "Large mode area fibers with asymmetric bend compensation," *Optics Express*, 19:21868-21873 (Oct. 24, 2011).
Fini et al., "Bend-compensated large-mode-area fibers: achieving robust single-modedness with transformation optics," *Optics Express*, 21:19173-19179 (Aug. 12, 2013).
Fox et al., "Effect of low-earth orbit space on radiation-induced absorption in rare-earth-doped optical fibers," *J. Non-Cryst. Solids*, 378:79-88 (2013).
Fox et al., "Gamma Radiation Effects in Yb-Doped Optical Fiber," *Proc. of the SPIE*, 6453:645:328-1-645328-9 (2007).
Fox et al., "Gamma-Radiation-Induced Photodarkening in Unpumped Optical Fibers Doped with Rare-Earth Constituents," *IEEE Trans. on Nuclear Science*, 57:1618-1625 (Jun. 2010).
Fox et al., "Investigation of radiation-induced photodarkening in passive erbium-, ytterbium-, and Yb/Er co-doped optical fibers," *Proc. of the SPIE*, 6713:67130R-1-67130R-9 (Sep. 26, 2007).
Fox et al., "Spectrally Resolved Transmission Loss in Gamma Irradiated Yb-Doped Optical Fibers," *IEEE J. Quant. Electron.*, 44:581-586 (Jun. 2008).
Fox et al., "Temperature and Dose-Rate Effects in Gamma Irradiated Rare-Earth Doped Fibers," *Proc. of SPIE*, 7095:70950B-1-70950B-8 (2008).
Ghasemi et al., "Beam shaping design for coupling high power diode laser stack to fiber," *Applied Optics*, 50:2927-2930 (Jun. 20, 2011).
Goers et al., "Development of a Compact Gas Imaging Sensor Employing cw Fiber-Amp-Pumped PPLN OPO," *Conference on Lasers and Electro-Optics*, OSA Technical Digest (Optical Society of America, Washington, DC), p. 521 (2001).
Goldberg et al., "Deep UV Generation by Frequency Quadrupling of a High-Power GaAlAs Semiconductor Laser," *Optics Lett.*, 20:1145-1147 (May 15, 1995).
Goldberg et al., "High Efficiency 3 W Side-Pumped Yb Fiber Amplifier and Laser," *Conference on Lasers and Electro-Optics*, OSA Technical Digest (Optical Society of America, Washington, DC), p. 11-12 (1999).
Goldberg et al., "High-Power Superfluorescent Source with a Side-Pumped Yb-Doped Double-Cladding Fiber," *Optics Letters*, 23:1037-1039 (Jul. 1, 1998).
Goldberg et al., "Highly Efficient 4-W Yb-Doped Fiber Amplifier Pumped by a Broad-Stripe Laser Diode," *Optics Lett.*, 24:673-675 (May 15, 1999).

Goldberg et al., "Tunable UV Generation at 286 nm by Frequency Tripling of a High-Power Modelocked Semiconductor Laser," *Optics Lett.*, 20:1640-1642 (Aug. 1, 1995).
Golub, "Laser Beam Splitting by Diffractive Optics," *Optics and Photonics News*, 6 pages (Feb. 2004).
Han et al., "Reshaping collimated laser beams with Gaussian profile to uniform profiles," *Applied Optics*, 22:3644-3647 (Nov. 15, 1983).
Headrick et al., "Application of laser photofragmentation-resonance enhanced multiphoton ionization to ion mobility spectrometry," *Applied Optics*, 49:2204-2214 (Apr. 10, 2010).
Hemenway et al., "Advances in high-brightness fiber-coupled laser modules for pumping multi-kW CW fiber lasers," Proceedings of SPIE, 10086:1008605-1-1008605-7 (2017).
Hemenway et al.,"High-brightness, fiber-coupled pump modules in fiber laser applications," *Proc. of SPIE*, 8961:89611V-1-89611V-12 (2014).
Hoops et al., "Detection of mercuric chloride by photofragment emission using a frequency-converted fiber amplifier," *Applied Optics*, 46:4008-4014 (Jul. 1, 2007).
Hotoleanu et al., "High Order Mode Suppression in Large Mode Area Active Fibers by Controlling the Radial Distribution of the Rare Earth Dopant," *Proc. of the SPIE*, 6102:61021T-1-61021T-8 (2006).
"How to Select a Beamsplitter," IDEX—Optics & Photonics Marketplace, available at: https://www.cvilaseroptics.com/file/general/beamSplitters.pdf, 5 pages (Jan. 8, 2014).
Huang et al., "Double-cutting beam shaping technique for high-power diode laser area light source," *Optical Engineering*, 52:106108-1-106108-6 (Oct. 2013).
International Search Report and Written Opinion from International Application No. PCT/US2017/034848, dated Nov. 28, 2017, 15 pages.
Ishiguro et al., "High Efficiency 4-kW Fiber Laser Cutting Machine," *Rev. Laser Eng.*, 39:680-684 (2011).
Johnson et al., "Experimental and Theoretical Study of Inhomogeneous Electron Transfer in Betaine: Comparisons of Measured and Predicted Spectral Dynamics," *Chem. Phys.*, 176:555-574 (Oct. 15, 1993).
Johnson et al., "Ultrafast Experiments on the Role of Vibrational Modes in Electron Transfer," *Pure and Applied Chem.*, 64:1219-1224 (1992).
Kliner, "Novel, High-Brightness, Fibre Laser Platform for kW Materials Processing Applications," 2015 European Conference on Lasers and Electro-Optics—European Quantum Electronics Conference (Optical Society of America, 2015), paper CJ_11_2, 1 page (2015).
Kliner et al., "4-kW fiber laser for metal cutting and welding," *Proc. of SPIE*, 7914:791418-791418-8 (2011).
Kliner et al., "Comparison of Experimental and Theoretical Absolute Rates for Intervalence Electron Transfer," *J. Am. Chem. Soc.*, 114:8323-8325 (1992).
Kliner et al., "Comparison of Experimental and Theoretical Integral Cross Sections for $D + H_2(v=1, j=1) \rightarrow HD(v'=1, j') + H$," *J. Chem. Phys.*, 95:1648-1662 (Aug. 1, 1991).
Kliner et al., "$D + H_2(v=1, J=1)$: Rovibronic State to Rovibronic State Reaction Dynamics," *J. Chem. Phys.*, 92:2107-2109 (Feb. 1, 1990).
Kliner et al. "Effect of Indistinguishable Nuclei on Product Rotational Distributions: $H + HI \rightarrow H_2 + I$ reaction[a]," *J. Chem Phys.*, 90:4625-4327 (Apr. 15, 1989).
Kliner et al., "Efficient second, third, fourth, and fifth harmonic generation of a Yb-doped fiber amplifier," *Optics Communications*, 210:393-398 (Sep. 15, 2002).
Kliner et al., "Efficient UV and Visible Generation Using a Pulsed Yb-Doped Fiber Amplifier," *Conference on Lasers and Electro-Optics*, OSA Technical Digest (Optical Society of America, Washington, DC), p. CPDC10-1-CPDC10-3 (2002).
Kliner et al., "Efficient visible and UV generation by frequency conversion of a mode-filtered fiber amplifier," *Proc. of SPIE*, 4974:230-235 (2003).
Kliner et al., "Fiber laser allows processing of highly reflective materials," *Industrial Laser Solutions*, 31:1-9 (Mar. 16, 2016).

(56) References Cited

OTHER PUBLICATIONS

Kliner et al., "High-Power Fiber Lasers," *Photonics & Imaging Technology*, pp. 2-5 (Mar. 2017).
Kliner et al., "Laboratory Investigation of the Catalytic Reduction Technique for Detection of Atmospheric $NO_y$," *J. Geophys. Res.*, 102:10759-10776 (May 20, 1997).
Kliner et al., "Laser Reflections: How fiber laser users are successfully processing highly reflective metals," Shop Floor Lasers, available at: http://www.shopfloorlasers.com/laser-cutting/fiber/354-laser-reflections, 9 pages (Jan./Feb. 2017).
Kliner et al., "Measurements of Ground-State OH Rotational Energy-Transfer Rates," *J. Chem. Phys.*, 110:412-422 (Jan. 1, 1999).
Kliner et al., "Mode-Filtered Fiber Amplifier," Sandia National Laboratories—Brochure, 44 pages (2007).
Kliner et al., "Narrow-Band, Tunable, Semiconductor-Laser-Based Source for Deep-UV Absorption Spectroscopy," *Optics Lett.*, 22:1418-1420 (Sep. 15, 1997).
Kliner et al., "Overview of Sandia's fiber laser program," *Proceedings of SPIE—The International Society for Optical Engineering*, 6952:695202-1-695202-12 (2008).
Kliner et al., "Photodissociation and Vibrational Relaxation of $I_2^-$ in Ethanol," *J. Chem. Phys.*, 98:5375-5389 (Apr. 1, 1993).
Kliner et al., "Polarization-Maintaining Amplifier Employing Double-Clad, Bow-Tie Fiber," *Optics Lett.*, 26:184-186 (Feb. 15, 2001).
Kliner et al., "Power Scaling of Diffraction-Limited Fiber Sources," *Proc. of SPIE*, 5647:550-556 (2005).
Kliner et al., "Power Scaling of Rare-Earth-Doped Fiber Sources," *Proc. of SPIE*, 5653:257-261 (2005).
Kliner et al., "Product Internal-State Distribution for the Reaction H + HI → $H_2$ + I," *J. Chem. Phys.*, 95:1663-1670 (Aug. 1, 1991).
Kliner et al., "The D + $H_2$ Reaction: Comparison of Experiment with Quantum-Mechanical and Quasiclassical Calculations," *Chem. Phys. Lett.*, 166:107-111 (Feb. 16, 1990).
Kliner et al., "The H+para-$H_2$ reaction: Influence of dynamical resonances on $H_2$(v' = 1, j' = 1 and 3) Integral Cross Sections," *J. Chem. Phys.*, 94:1069-1080 (Jan. 15, 1991).
Koplow et al., A New Method for Side Pumping of Double-Clad Fiber Sources, *J. Quantum Electron.*, 39:529-540 (2003).
Koplow et al., "Compact 1-W Yb-Doped Double-Cladding Fiber Amplifier Using V-Groove Side-Pumping," *IEEE Photonics Technol. Lett.*, 10:793-795 (Jun. 1998).
Koplow et al., "Development of a Narrowband, Tunable, Frequency-Quadrupled Diode Laser for UV Absorption Spectroscopy," *Appl. Optics*, 37:3954-3960 (Jun. 20, 1998).
Koplow et al., "Diode-Bar Side-Pumping of Double-Clad Fibers," *Proc. of SPIE*, 5709:284-300 (Apr. 22, 2005).
Koplow et al., "High Power PM Fiber Amplifier and Broadband Source," *Optical Fiber Communication Conference*, OSA Technical Digest (Optical Society of America, Washington, DC), p. 12-13 (2000).
Koplow et al., "Polarization-Maintaining, Double-Clad Fiber Amplifier Employing Externally Applied Stress-Induced Birefringence," *Optics Lett.*, 25:387-389 (Mar. 15, 2000).
Koplow et al., "Single-mode operation of a coiled multimode fiber amplifier," *Optics Letters*, 25:442-444 (Apr. 1, 2000).
Koplow et al., Use of Bend Loss to Obtain Single-Transverse-Mode Operation of a Multimode Fiber Amplifier, *Conference on Lasers and Electro-Optics*, OSA Technical Digest (Optical Society of America, Washington, DC), p. 286-287 (2000).
Koplow et al., "UV Generation by Frequency Quadrupling of a Yb-Doped Fiber Amplifier," *IEEE Photonics Technol. Lett.*, 10:75-77 (Jan. 1998).
Koponen et al., "Photodarkening Measurements in Large-Mode-Area Fibers," *Proc. of SPIE*, 6453:64531E-1-64531E-12 (2007).
Kotlyar et al., "Asymmetric Bessel-Gauss beams," *J. Opt. Soc. Am. A*, 31:1977-1983 (Sep. 2014).
Kulp et al., "The application of quasi-phase-matched parametric light sources to practical infrared chemical sensing systems," *Appl. Phys. B*, 75:317-327 (2002).

Longhi et al., "Self-focusing and nonlinear periodic beams in parabolic index optical fibres," *J. Opt. B: Quantum Semiclass. Opt.*, 6:S303-S308 (May 2004).
Maechling et al., "Sum Frequency Spectra in the C—H Stretch Region of Adsorbates on Iron," *Appl. Spectrosc.*, 47:167-172 (1993).
McComb et al., "Pulsed Yb:fiber system capable of >250 kW peak power with tunable pulses in the 50 ps to 1.5 ns range," *Proc. of SPIE*, 8601:86012T-1-86012T-11 (2013).
Moore et al., "Diode-bar side pumping of double-clad fibers," *Proc. of SPIE*, 6453:64530K-1-64530K-9 (2007).
Neuhauser et al., "State-to-State Rates for the D + $H_2$(v = 1, j = 1) → HD(v', j') + H Reaction: Predictions and Measurements," *Science*, 257:519-522 (Jul. 24, 1992).
Office action from U.S. Appl. No. 15/607,399, dated Sep. 20, 2017, 25 pages.
Office action from U.S. Appl. No. 15/607,410, dated Oct. 3, 2017, 32 pages.
Price et al., "High-brightness fiber-coupled pump laser development," *Proc. of SPIE*, 7583:758308-1-758308-7 (2010).
Rinnen et al., "Construction of a Shuttered Time-of-Flight Mass Spectrometer for Selective Ion Detection," *Rev. Sci. Instrum.*, 60:717-719 (Apr. 1989).
Rinnen et al., "Effect of Indistinguishable Nuclei on Product Rotational Distributions: D + DI → $D_2$ + I," *Chem. Phys. Lett.*, 169:365-371 (Jun. 15, 1990).
Rinnen et al. "Quantitative Determination of HD Internal State Distributions via (2+1) REMPI," *Isr. J. Chem.*, 29:369-382 (1989).
Rinnen et al., "Quantitative determination of $H_2$, HD, and $D_2$ internal state distributions via (2+1) resonance-enhanced multiphoton ionization," *J. Chem. Phys.*, 95:214-225 (Jul. 1, 1991).
Rinnen et al., "The H + $D^2$ Reaction: "Prompt" HD Distributions at High Collision Energies," *Chem. Phys. Lett.*, 153:371-375 (Dec. 23, 1988).
Rinnen et al., "The H + $D_2$ Reaction: Quantum State Distributions at Collision Energies of 1.3 and 0.55 eV," *J. Chem. Phys.*, 91:7514-7529 (Dec. 15, 1989).
Romero et al., "Lossless laser beam shaping," *J. Opt. Soc. Am. A*, 13:751-760 (Apr. 1996).
Sanchez-Rubio et al., "Wavelength Beam Combining for Power and Brightness Scaling of Laser Systems," *Lincoln Laboratory Journal*, 20:52-66 (2014).
Saracco et al., Compact, 17 W average power, 100 kW peak power, nanosecond fiber laser system, *Proc. of SPIE*, 8601:86012U-1-86012U-13 (2013).
Schrader et al., "Fiber-Based Laser with Tunable Repetition Rate, Fixed Pulse Duration, and Multiple Wavelength Output," *Proc. of the SPIE*, 6453:64530D-1-64530D-9 (2007).
Schrader et al., "High-Power Fiber Amplifier with Widely Tunable Repetition Rate, Fixed Pulse Duration, and Multiple Output Wavelengths," *Optics Express*, 14:11528-11538 (Nov. 27, 2006).
Schrader et al., "Power scaling of fiber-based amplifiers seeded with microchip lasers," *Proc. of the SPIE*, 6871:68710T-1-68710T-11 (2008).
Sheehan et al., "Faserlaser zur Bearbeitung hochreflektierender Materialien (Fiber laser processing of highly reflective materials)," *Laser*, 3:95-94 (Jun. 2017).
Sheehan et al. "High-brightness fiber laser advances remote laser processing," *Industrial Laser Solutions*, 31:1-9 (Nov. 2, 2016).
Sun et al., "Optical Surface Transformation: Changing the optical surface by homogeneous optic-null medium at will," *Scientific Reports*, 5:16032-1-16032-20 (Oct. 30, 2015).
Tominaga et al., "Femtosecond Experiments and Absolute Rate Calculations on Intervalence Electron Transfer in Mixed-Valence Compounds," *J. Chem. Phys.*, 98:1228-1243 (Jan. 15, 1993).
Xiao et al., "Fiber coupler for mode selection and high-efficiency pump coupling," *Optics Letters*, 38:1170-1172 (Apr. 1, 2013).
Yaney et al., "Distributed-Feedback Dye Laser for Picosecond UV and Visible Spectroscopy," *Rev. Sci. Instrum*, 71:1296-1305 (Mar. 2000).
Yu et al., "1.2-kW single-mode fiber laser based on 100-W high-brightness pump diodes," *Proc. of SPIE*, 8237:82370G-1-82370G-7 (2012).

(56) References Cited

OTHER PUBLICATIONS

Alfano et al., "Photodissociation and Recombination Dynamics of $I_2^-$ in Solution," *Ultrafast Phenomena VIII*, (Springer-Verlag, New York), pp. 653-655 (1993).
Kliner et al., "Photodissociation Dynamics of $I_2$ in Solution," *Ultrafast Reaction Dynamics and Solvent Effects*, (American Institute of Physics, New York), pp. 16-35 (1994).
Tominaga et al., "Ultrafast Studies of Intervalence Charge Transfer," *Ultrafast Phenomena VIII*, (Springer-Verlag, New York), pp. 582-584 (1993).
Eichenholz, "Photonic-crystal fibers have many uses," Optoelectronics World, 4 pages (Aug. 2004).
Final Office action from U.S. Appl. No. 15/607,399, dated May 3, 2018, 31 pages.
Fox et al., "Radiation damage effects in doped fiber materials," *Proc. of the SPIE*, 6873:68731F-1-68731F-9 (2008).
Ghatak et al., "Design of Waveguide Refractive Index Profile to Obtain Flat Model Field," SPIE, 3666:40-44 (Apr. 1999).
Injeyan et al., "Introduction to Optical Fiber Lasers," *High-Power Laser Handbook*, pp. 436-439 (2011).
International Search Report and Written Opinion for related International Application No. PCT/US2016/041526, 6 pages, dated Oct. 20, 2016.
International Search Report and Written Opinion for related International Application No. PCT/US2016/053807, 6 pages, dated Jan. 19, 2017.
"Lasers & Fibers," NKT Photonics, available at: https://www.nktphotonics.com/lasers-fibers/technology/photonic-crystal-fibers/, 4 pages, retrieved Feb. 13, 2018.
Russell, "Photonic-Crystal Fibers," *IEEE JLT*, 24:4729-4749 (Dec. 2006).
Saleh et al., "Chapter 9.4 Holey and Photonic-Crystal Fibers," *Fundamentals of Photonics, Second Edition*, pp. 359-362 (2007).
"Triple Clad Ytterbium-Doped Polarization Maintaining Fibers," nuFERN Driven to Light Specifications, 1 page (Jan. 2006).
Varshney et al., "Design of a flat field fiber with very small dispersion slope," *Optical Fiber Technology*, 9(3):189-198 (Oct. 2003).
Barron et al., "Optical Trapping using a Lensed Multicore Fiber," Workshop on Specialty Optical Fibers and their Applications, OSA 2013, 2 pages (2013).
International Search Report and Written Opinion for International Application No. PCT/US2018/024944, dated Jul. 12, 2018, 8 pages.
International Search Report and Written Opinion for International Application No. PCT/US2018/023944, dated Aug. 2, 2018, 7 pages.
International Search Report and Written Opinion for International Application No. PCT/US2018/023963, dated Aug. 9, 2018, 7 pages.
International Search Report and Written Opinion for International Application No. PCT/US2018/024899, dated Aug. 9, 2018, 7 pages.
International Search Report and Written Opinion for International Application No. PCT/US2018/024955, dated Aug. 9, 2018, 8 pages.
International Search Report and Written Opinion for International Application No. PCT/US2018/024953, dated Aug. 16, 2018, 8 pages.
International Search Report and Written Opinion from International Application No. PCT/US2018/024227, dated Aug. 30, 2018, 7 pages.
Advisory Action from U.S. Appl. No. 15/607,410, dated Sep. 24, 2018, 6 pages.
Applicant-Initiated Interview Summary from U.S. Appl. No. 15/607,399, dated May 25, 2018, 3 pages.
Applicant-Initiated Interview Summary from U.S. Appl. No. 15/607,399, dated Jul. 27, 2018, 9 pages.
Applicant-Initiated Interview Summary from U.S. Appl. No. 15/607,410, dated May 25, 2018, 3 pages.
Applicant-Initiated Interview Summary from U.S. Appl. No. 15/607,410, dated Jul. 24, 2018, 9 pages.
Office action from U.S. Appl. No. 15/938,959, dated Jul. 18, 2018, 6 pages.
Office action from U.S. Appl. No. 15/939,064, dated Jul. 27, 2018, 7 pages.
Office action from U.S. Appl. No. 15/939,064, dated Oct. 5, 2018, 22 pages.
Office action from U.S. Appl. No. 15/938,959, dated Oct. 5, 2018, 22 pages.
Goldberg et al., "Deep UV Generation by Frequency Tripling and Quadrupling of a High-Power Modelocked Semiconductor Laser," Proceedings of the Quantum Electronics and Laser Science Conference, QPD18-2 (Baltimore) 2 pages (May 1995).
Affine Transformation—from Wolfram MathWorld, http://mathworld.wolfram.com/AffineTransformation.html, downloaded Feb. 21, 2014, 2 pages.
International Search Report and Written Opinion for International Application No. PCT/US2013/060470, 7 pages, dated Jan. 16, 2014.
International Search Report and Written Opinion for International Application No. PCT/US2014/017841, 5 pages, dated Jun. 5, 2014.
International Search Report and Written Opinion for International Application No. PCT/US2014/017836, 6 pages, dated Jun. 10, 2014.
International Search Report and Written Opinion for International Application No. PCT/US2016/063086, 6 pages, dated Mar. 23, 2017.
International Search Report and Written Opinion for International Application No. PCT/US2017/014182, 9 pages, dated Mar. 31, 2017.
International Search Report and Written Opinion for International Application No. PCT/US2018/026110, 12 pages, dated Aug. 8, 2018.
Product Brochure supplement entitled "Theory of Operation" by Cambridge Technology, 2 pages, downloaded Dec. 21, 2013.
International Search Report and Written Opinion from International Application No. PCT/US2018/024904, dated Aug. 30, 2018, 5 pages.
Office action from U.S. Appl. No. 15/607,399, dated Sep. 14, 2018, 19 pages.

* cited by examiner

ADJUSTABLE BEAM CHARACTERISTICS

RELATED APPLICATIONS

This application claims the benefit of U.S. Provisional Application No. 62/401,650, filed Sep. 29, 2016, and is related to the U.S. Patent Applications entitled "ADJUSTABLE BEAM CHARACTERISTICS", filed on May 26, 2017. These applications are incorporated by reference herein in their entireties.

TECHNICAL FIELD

The technology disclosed herein relates to fiber lasers and fiber-coupled lasers. More particularly, the disclosed technology relates to methods, apparatus, and systems for adjusting and maintaining adjusted optical beam characteristics (spot size, divergence profile, spatial profile, or beam shape, or the like or any combination thereof) at an output of a fiber laser or fiber-coupled laser.

BACKGROUND

The use of high-power fiber-coupled lasers continues to gain popularity for a variety of applications, such as materials processing, cutting, welding, and/or additive manufacturing. These lasers include, for example, fiber lasers, disk lasers, diode lasers, diode-pumped solid state lasers, and lamp-pumped solid state lasers. In these systems, optical power is delivered from the laser to a work piece via an optical fiber.

Various fiber-coupled laser materials processing tasks require different beam characteristics (e.g., spatial profiles and/or divergence profiles). For example, cutting thick metal and welding generally require a larger spot size than cutting thin metal. Ideally, the laser beam properties would be adjustable to enable optimized processing for these different tasks. Conventionally, users have two choices: (1) Employ a laser system with fixed beam characteristics that can be used for different tasks but is not optimal for most of them (i.e., a compromise between performance and flexibility); or (2) Purchase a laser system or accessories that offer variable beam characteristics but that add significant cost, size, weight, complexity, and perhaps performance degradation (e.g., optical loss) or reliability degradation (e.g., reduced robustness or up-time). Currently available laser systems capable of varying beam characteristics require the use of free-space optics or other complex and expensive add-on mechanisms (e.g., zoom lenses, mirrors, translatable or motorized lenses, combiners, etc.) in order to vary beam characteristics. No solution exists that provides the desired adjustability in beam characteristics that minimizes or eliminates reliance on the use of free-space optics or other extra components that add significant penalties in terms of cost, complexity, performance, and/or reliability. What is needed is an in-fiber apparatus for providing varying beam characteristics that does not require or minimizes the use of free-space optics and that can avoid significant cost, complexity, performance tradeoffs, and/or reliability degradation.

SUMMARY

At least disclosed herein are methods, systems and apparatus for varying optical beam characteristics. Methods may include, perturbing an optical beam propagating within a first length of fiber to adjust one or more beam characteristics of the optical beam in the first length of fiber or a second length of fiber or a combination thereof, coupling the perturbed optical beam into a second length of fiber and maintaining at least a portion of one or more adjusted beam characteristics within a second length of fiber having one or more confinement regions. Methods may further include generating a selected output beam from the second length of fiber having the adjusted beam characteristics responsive to a selection of a first refractive index profile (RIP) of the first length of fiber or a second RIP of the second length of fiber or a combination thereof. In some examples, the one or more beam characteristics of the perturbed optical beam are adjusted based on selection of one or more core dimensions of the first length of fiber or one or more confinement region dimensions of the second length of fiber or a combination thereof to generate an adjusted optical beam responsive to perturbing the first length of fiber, the adjusted optical beam having a particular adjusted: beam diameter, divergence distribution, beam parameter product (BPP), intensity distribution, luminance, $M^2$ value, numerical aperture (NA), optical intensity, power density, radial beam position, radiance, or spot size, or any combination thereof at an output of the second length of fiber. In some example, methods include perturbing the optical beam by bending the first length of fiber to alter a bend radius or alter a length of a bent region of the first length of fiber or a combination thereof such that one or more modes of the optical beam are displaced radially with respect to a longitudinal axis of the first length of fiber wherein the second length of fiber has an RIP that defines a first confinement region and a second confinement region. In some examples, the adjusted one or more beam characteristics are produced by confining the optical beam in the two or more confinement regions of the second length of fiber. The example methods may further comprise launching the perturbed optical beam from the first length of fiber into the first confinement region or the second confinement region or a combination thereof such that one or more displaced modes of the optical beam are selectively coupled into and maintained in the first confinement region or the second confinement region, or a combination thereof. Disclosed methods may include, perturbing the one or more beam characteristics of the optical beam by perturbing the first length of fiber or the optical beam in the first length of fiber or a combination thereof to adjust at least one beam characteristic of the optical beam at an output of the second length of fiber. Perturbing the first length of fiber may include bending, bending over a particular length, microbending, applying acousto-optic excitation, thermal perturbation, stretching, or applying piezo-electric perturbation, or any combination thereof. The second length of fiber may comprise a first confinement region comprising a central core and a second confinement region comprising an annular core encompassing the first confinement region. Adjusting the one or more beam characteristics of the optical beam may include selecting a RIP of the first length of fiber to generate a desired mode shape of a lowest order mode, one or more higher order modes, or a combination thereof subsequent to the adjusting. In some examples, the first length of fiber has a core with a parabolic index profile radially spanning some or all of the core. A RIP of the first length of fiber may be selected to increase or decrease a width of the lowest order mode, the higher order modes, or a combination thereof responsive to the perturbing the optical beam. The first length of fiber or the second length of fiber or a combination thereof may include at least one divergence structure configured to modify a divergence profile of the optical beam. The confinement regions may be separated by one or more cladding structures, wherein the divergence structure may be disposed within at least one confinement region separate from the cladding structure and comprising material having a lower index than the confinement region adjacent to the divergence structure. In some examples, the second length of fiber may be azimuthally asymmetric.

Apparatus disclosed herein may include an optical beam delivery device, comprising a first length of fiber comprising a first RIP formed to enable modification of one or more beam characteristics of an optical beam by a perturbation device and a second length of fiber having a second RIP coupled to the first length of fiber, the second RIP formed to confine at least a portion of the modified beam characteristics of the optical beam within one or more confinement regions. In some examples, the first RIP and the second RIP are different. In some examples, the second length of fiber comprises a plurality of confinement regions. The perturbation device may be coupled to the first length of fiber or integral with the first length of fiber or a combination thereof. The first length of fiber may comprise a graded-index RIP in at least a radially central portion and the second length of fiber has a first confinement region comprising a central core and a second confinement region that is annular and encompasses the first confinement region. The first confinement region and the second confinement region may be separated by a cladding structure having a refractive index that is lower than the indexes of first confinement region and the second confinement region. The cladding structure may comprise a fluorosilicate material. The first length of fiber or the second length of fiber or a combination thereof may include at least one divergence structure configured to modify a divergence profile of the optical beam and wherein the divergence structure may comprise a first material having a lower index of refraction than a second material encompassing the divergence structure. The second length of fiber may be azimuthally asymmetric and may comprise a first confinement region comprising a first core and a second confinement region comprising a second core. In some examples, the first confinement region and the second confinement region may be coaxial. In other examples, the first confinement region and the second confinement region may be non-coaxial. The second confinement region may be crescent shaped in some examples. The first RIP may be parabolic in a first portion having a first radius. In some examples, the first RIP may be constant in a second portion having a second radius, wherein the second radius is larger than the first radius. The first RIP may comprise a radially graded index extending to an edge of a core of the first length of fiber, wherein the first RIP is formed to increase or decrease a width of one or more modes of the optical beam responsive to the modification of the beam characteristics by the perturbation device. The first length of fiber may have a radially graded index core extending to a first radius followed by a constant index portion extending to a second radius, wherein the second radius is larger than the first radius. In some examples, the second length of fiber comprises a central core having a diameter in a range of about 0 to 100 microns, a first annular core encompassing the central core having a diameter in a range of about 10 to 600 microns and a second annual core having a diameter in a range of about 20 to 1200 microns. The perturbation device may comprise a bending assembly configured to alter a bend radius or alter a bend length of the first length of fiber or a combination thereof to modify the beam characteristics of the optical beam. In some examples, a perturbation assembly may comprise a bending assembly, a mandrel, micro-bend in the fiber, an acousto-optic transducer, a thermal device, a fiber stretcher, or a piezo-electric device, or any combination thereof. The first length of fiber and the second length of fiber may be separate passive fibers that are spliced together.

Systems disclosed herein may include, an optical beam delivery system, comprising an optical fiber including a first and second length of fiber and an optical system coupled to the second length of fiber including one or more free-space optics configured to receive and transmit an optical beam comprising modified beam characteristics. The first length of fiber may include a first RIP formed to enable, at least in part, modification of one or more beam characteristics of an optical beam by a perturbation assembly arranged to modify the one or more beam characteristics, the perturbation assembly may be coupled to the first length of fiber or integral with the first length of fiber, or a combination thereof. The second length of fiber may be coupled to the first length of fiber and may include a second RIP formed to preserve at least a portion of the one or more beam characteristics of the optical beam modified by the perturbation assembly within one or more first confinement regions. In some examples, the first RIP and the second RIP are different.

The optical beam delivery system may further include a first process fiber coupled between a first process head and the optical system, wherein the first process fiber is configured to receive the optical beam comprising the modified one or more beam characteristics. The first process fiber may comprise a third RIP configured to preserve at least a portion of the modified one or more beam characteristics of the optical beam within one or more second confinement regions of the first process fiber. In an example, at least a portion of the free-space optics may be configured to further modify the modified one or more beam characteristics of the optical beam. The one or more beam characteristics may include beam diameter, divergence distribution, BPP, intensity distribution, luminance, $M^2$ value, NA, optical intensity, power density, radial beam position, radiance, or spot size, or any combination thereof. The third RIP may be the same as or different from the second RIP. The third RIP may be configured to further modify the modified one or more beam characteristics of the optical beam. In some examples, at least one of the one or more second confinement regions includes at least one divergence structure configured to modify a divergence profile of the optical beam. The divergence structure may comprise an area of lower-index material than that of the second confinement region.

The optical beam delivery system may further include a second process fiber having a fourth RIP that is coupled between the optical system and a second process head, wherein the second process fiber may be configured to receive the optical beam comprising the modified one or more beam characteristics within one or more second confinement regions of the second process fiber. In some examples, the first process fiber or the second process fiber or a combination thereof may be configured to further modify the modified one or more beam characteristics of the optical beam. The second process fiber may include at least one divergence structure configured to modify a divergence profile of the optical beam. The second process fiber may comprise a central core surrounded by at least one of the one or more second confinement regions, wherein the core and the second confinement region are separated by a cladding structure having a first index of refraction that is lower than a second index of refraction of the central core and a third index of refraction of the second confinement region, wherein the second confinement region may include the at least one divergence structure. The at least one divergence structure may comprise an area of lower-index material than that of the second confinement region. In an example, the second RIP may be different from the third RIP or the fourth RIP or a combination thereof. Alternatively, the second RIP may be the same as the third RIP or the fourth RIP or a combination thereof. The one or more beam characteristics that may be modified can include beam diameter, divergence distribution, BPP, intensity distribution, luminance, $M^2$ value, NA, optical intensity, power density, radial beam position, radiance, or spot size, or any combination thereof.

In some examples, at least a portion of the free-space optics may be configured to further modify the modified one or more beam characteristics of the optical beam. The first process fiber may be coupled between a first process head and the optical system, wherein the first process fiber is configured to receive the optical beam comprising twice modified one or more beam characteristics. The first process fiber may have a third RIP configured to preserve at least a portion of the twice modified one or more beam characteristics of the optical beam within one or more second confinement regions of the first process fiber. The third RIP may be different from the second RIP, wherein the third RIP is configured to further modify the twice modified one or more beam characteristics of the optical beam.

In some examples, the first process fiber may include a divergence structure configured to further modify the twice modified one or more beam characteristics of the optical beam. In some examples, a second process fiber may be coupled between the optical system and a second process head, wherein the second process fiber is configured to receive the twice modified one or more beam characteristics.

In some examples, the first process fiber or the second process fiber or a combination thereof is configured to further modify the twice modified one or more beam characteristics of the optical beam. The first process fiber or the second process fiber or a combination thereof may include at least one divergence structure configured to further modify the twice modified one or more beam characteristics of the optical beam. The optical system may be a fiber-to-fiber coupler, a fiber-to-fiber switch or a process head, or the like or a combination thereof.

BRIEF DESCRIPTION OF THE DRAWINGS

The accompanying drawings, wherein like reference numerals represent like elements, are incorporated in and constitute a part of this specification and, together with the description, explain the advantages and principles of the presently disclosed technology. In the drawings.

DETAILED DESCRIPTION

Figure 1:
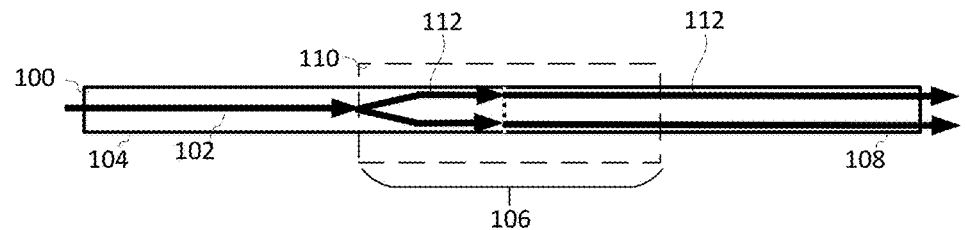
FIG. 1 illustrates an example fiber structure for providing a laser beam having variable beam characteristics.

As used herein throughout this disclosure and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. Also, the terms "modify" and "adjust" are used interchangeably to mean "alter."

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus are referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like. These terms are used for convenient description, but do not imply any particular spatial orientation.

Definitions

Definitions of words and terms as used herein:

1. The term "beam characteristics" refers to one or more of the following terms used to describe an optical beam. In general, the beam characteristics of most interest depend on the specifics of the application or optical system.
2. The term "beam diameter" is defined as the distance across the center of the beam along an axis for which the irradiance (intensity) equals $1/e^2$ of the maximum irradiance. While examples disclosed herein generally use beams that propagate in azimuthally symmetric modes, elliptical or other beam shapes can be used, and beam diameter can be different along different axes. Circular beams are characterized by a single beam diameter. Other beam shapes can have different beam diameters along different axes.
3. The term "spot size" is the radial distance (radius) from the center point of maximum irradiance to the $1/e^2$ point.
4. The term "beam divergence distribution" is the power vs the full cone angle. This quantity is sometimes called the "angular distribution" or "NA distribution."
5. The term "beam parameter product" (BPP) of a laser beam is defined as the product of the beam radius (measured at the beam waist) and the beam divergence half-angle (measured in the far field). The units of BPP are typically mm-mrad.
6. A "confinement fiber" is defined to be a fiber that possesses one or more confinement regions, wherein a confinement region comprises a higher-index region (core region) surrounded by a lower-index region (cladding region). The RIP of a confinement fiber may include one or more higher-index regions (core regions) surrounded by lower-index regions (cladding regions), wherein light is guided in the higher-index regions. Each confinement region and each cladding region can have any RIP, including but not limited to step-index and graded-index. The confinement regions may or may not be concentric and may be a variety of shapes such as circular, annular, polygonal, arcuate, elliptical, or irregular, or the like or any combination thereof. The confinement regions in a particular confinement fiber may all have the same shape or may be different shapes. Moreover, confinement regions may be co-axial or may have offset axes with respect to one another. Confinement regions may be of uniform thickness about a central axis in the longitudinal direction, or the thicknesses may vary about the central axis in the longitudinal direction.
7. The term "intensity distribution" refers to optical intensity as a function of position along a line (1D profile) or on a plane (2D profile). The line or plane is usually taken perpendicular to the propagation direction of the light. It is a quantitative property.
8. "Luminance" is a photometric measure of the luminous intensity per unit area of light travelling in a given direction.
9. "$M^2$ factor" (also called "beam quality factor" or "beam propagation factor") is a dimensionless parameter for quantifying the beam quality of laser beams, with $M^2=1$ being a diffraction-limited beam, and larger $M^2$ values corresponding to lower beam quality. $M^2$ is equal to the BPP divided by $\lambda/\pi$, where $\lambda$ is the wavelength of the beam in microns (if BPP is expressed in units of mm-mrad).
10. The term "numerical aperture" or "NA" of an optical system is a dimensionless number that characterizes the range of angles over which the system can accept or emit light.
11. The term "optical intensity" is not an official (SI) unit, but is used to denote incident power per unit area on a surface or passing through a plane.
12. The term "power density" refers to optical power per unit area, although this is also referred to as "optical intensity."
13. The term "radial beam position" refers to the position of a beam in a fiber measured with respect to the center of the fiber core in a direction perpendicular to the fiber axis.
14. "Radiance" is the radiation emitted per unit solid angle in a given direction by a unit area of an optical source (e.g., a laser). Radiance may be altered by changing the beam intensity distribution and/or beam divergence profile or distribution. The ability to vary the radiance profile of a laser beam implies the ability to vary the BPP.
15. The term "refractive-index profile" or "RIP" refers to the refractive index as a function of position along a line (1D) or in a plane (2D) perpendicular to the fiber axis. Many fibers are azimuthally symmetric, in which case the 1D RIP is identical for any azimuthal angle.
16. A "step-index fiber" has a RIP that is flat (refractive index independent of position) within the fiber core.
17. A "graded-index fiber" has a RIP in which the refractive index decreases with increasing radial position (i.e., with increasing distance from the center of the fiber core).
18. A "parabolic-index fiber" is a specific case of a graded-index fiber in which the refractive index decreases quadratically with increasing distance from the center of the fiber core.

Fiber for Varying Beam Characteristics

Disclosed herein are methods, systems, and apparatus configured to provide a fiber operable to provide a laser beam having variable beam characteristics (VBC) that may reduce cost, complexity, optical loss, or other drawbacks of the conventional methods described above. This VBC fiber is configured to vary a wide variety of optical beam characteristics. Such beam characteristics can be controlled using the VBC fiber thus allowing users to tune various beam characteristics to suit the particular requirements of an extensive variety of laser processing applications. For example, a VBC fiber may be used to tune: beam diameter, beam divergence distribution, BPP, intensity distribution, $M^2$ factor, NA, optical intensity, power density, radial beam position, radiance, spot size, or the like, or any combination thereof.

In general, the disclosed technology entails coupling a laser beam into a fiber in which the characteristics of the laser beam in the fiber can be adjusted by perturbing the laser beam and/or perturbing a first length of fiber by any of a variety of methods (e.g., bending the fiber or introducing one or more other perturbations) and fully or partially maintaining adjusted beam characteristics in a second length of fiber. The second length of fiber is specially configured to maintain and/or further modify the adjusted beam characteristics. In some cases, the second length of fiber preserves the adjusted beam characteristics through delivery of the laser beam to its ultimate use (e.g., materials processing). The first and second lengths of fiber may comprise the same or different fibers.

The disclosed technology is compatible with fiber lasers and fiber-coupled lasers. Fiber-coupled lasers typically deliver an output via a delivery fiber having a step-index refractive index profile (RIP), i.e., a flat or constant refractive index within the fiber core. In reality, the RIP of the delivery fiber may not be perfectly flat, depending on the design of the fiber. Important parameters are the fiber core diameter ($d_{core}$) and NA. The core diameter is typically in the range of 10-1000 micron (although other values are possible), and the NA is typically in the range of 0.06-0.22 (although other values are possible). A delivery fiber from the laser may be routed directly to the process head or work piece, or it may be routed to a fiber-to-fiber coupler (FFC) or fiber-to-fiber switch (FFS), which couples the light from the delivery fiber into a process fiber that transmits the beam to the process head or the work piece.

Most materials processing tools, especially those at high power (>1 kW), employ multimode (MM) fiber, but some employ single-mode (SM) fiber, which is at the lower end of the $d_{core}$ and NA ranges. The beam characteristics from a SM fiber are uniquely determined by the fiber parameters. The beam characteristics from a MM fiber, however, can vary (unit-to-unit and/or as a function of laser power and time), depending on the beam characteristics from the laser source (s) coupled into the fiber, the launching or splicing conditions into the fiber, the fiber RIP, and the static and dynamic geometry of the fiber (bending, coiling, motion, microbending, etc.). For both SM and MM delivery fibers, the beam characteristics may not be optimum for a given materials processing task, and it is unlikely to be optimum for a range of tasks, motivating the desire to be able to systematically vary the beam characteristics in order to customize or optimize them for a particular processing task.

In one example, the VBC fiber may have a first length and a second length and may be configured to be interposed as an in-fiber device between the delivery fiber and the process head to provide the desired adjustability of the beam characteristics. To enable adjustment of the beam, a perturbation device and/or assembly is disposed in close proximity to and/or coupled with the VBC fiber and is responsible for perturbing the beam in a first length such that the beam's characteristics are altered in the first length of fiber, and the altered characteristics are preserved or further altered as the beam propagates in the second length of fiber. The perturbed beam is launched into a second length of the VBC fiber configured to conserve adjusted beam characteristics. The first and second lengths of fiber may be the same or different fibers and/or the second length of fiber may comprise a confinement fiber. The beam characteristics that are conserved by the second length of VBC fiber may include any of: beam diameter, beam divergence distribution, BPP, intensity distribution, luminance, $M^2$ factor, NA, optical intensity, power density, radial beam position, radiance, spot size, or the like, or any combination thereof.

FIG. 1 illustrates an example VBC fiber 100 for providing a laser beam having variable beam characteristics without requiring the use of free-space optics to change the beam characteristics. VBC fiber 100 comprises a first length of fiber 104 and a second length of fiber 108. First length of fiber 104 and second length of fiber 108 may be the same or different fibers and may have the same or different RIPs. The first length of fiber 104 and the second length of fiber 108 may be joined together by a splice. First length of fiber 104 and second length of fiber 108 may be coupled in other ways, may be spaced apart, or may be connected via an interposing component such as another length of fiber, free-space optics, glue, index-matching material, or the like or any combination thereof.

A perturbation device 110 is disposed proximal to and/or envelops perturbation region 106. Perturbation device 110 may be a device, assembly, in-fiber structure, and/or other feature. Perturbation device 110 at least perturbs optical beam 102 in first length of fiber 104 or second length of fiber 108 or a combination thereof in order to adjust one or more beam characteristics of optical beam 102. Adjustment of beam 102 responsive to perturbation by perturbation device 110 may occur in first length of fiber 104 or second length of fiber 108 or a combination thereof. Perturbation region 106 may extend over various widths and may or may not extend into a portion of second length of fiber 108. As beam 102 propagates in VBC fiber 100, perturbation device 110 may physically act on VBC fiber 100 to perturb the fiber and adjust the characteristics of beam 102. Alternatively, perturbation device 110 may act directly on beam 102 to alter its beam characteristics. Subsequent to being adjusted, perturbed beam 112 has different beam characteristics than beam 102, which will be fully or partially conserved in second length of fiber 108. In another example, perturbation device 110 need not be disposed near a splice. Moreover, a splice may not be needed at all, for example VBC fiber 100 may be a single fiber, first length of fiber and second length of fiber could be spaced apart, or secured with a small gap (air-spaced or filled with an optical material, such as optical cement or an index-matching material).

Perturbed beam 112 is launched into second length of fiber 108, where perturbed beam 112 characteristics are largely maintained or continue to evolve as perturbed beam 112 propagates yielding the adjusted beam characteristics at the output of second length of fiber 108. In one example, the new beam characteristics may include an adjusted intensity distribution. In an example, an altered beam intensity distribution will be conserved in various structurally bounded confinement regions of second length of fiber 108. Thus, the beam intensity distribution may be tuned to a desired beam intensity distribution optimized for a particular laser processing task. In general, the intensity distribution of perturbed beam 112 will evolve as it propagates in the second length of fiber 108 to fill the confinement region(s) into which perturbed beam 112 is launched responsive to conditions in first length of fiber 104 and perturbation caused by perturbation device 110. In addition, the angular distribution may evolve as the beam propagates in the second fiber, depending on launch conditions and fiber characteristics. In general, fibers largely preserve the input divergence distribution, but the distribution can be broadened if the input divergence distribution is narrow and/or if the fiber has irregularities or deliberate features that perturb the divergence distribution. The various confinement regions, perturbations, and fiber features of second length of fiber 108 are described in greater detail below. Beams 102 and 112 are conceptual abstractions intended to illustrate how a beam may propagate through a VBC fiber 100 for providing variable beam characteristics and are not intended to closely model the behavior of a particular optical beam.

VBC fiber 100 may be manufactured by a variety of methods including PCVD (Plasma Chemical Vapor Deposition), OVD (Outside Vapor Deposition), VAD (Vapor Axial Deposition), MOCVD (Metal-Organic Chemical Vapor Deposition.) and/or DND (Direct Nanoparticle Deposition). VBC fiber 100 may comprise a variety of materials. For example, VBC fiber 100 may comprise $SiO_2$, $SiO_2$ doped with $GeO_2$, germanosilicate, phosphorus pentoxide, phosphosilicate, $Al_2O_3$, aluminosilicate, or the like or any combinations thereof. Confinement regions may be bounded by cladding doped with fluorine, boron, or the like or any combinations thereof. Other dopants may be added to active fibers, including rare-earth ions such as $Er^{3+}$ (erbium), $Yb^{3+}$ (ytterbium), $Nd^{3+}$ (neodymium), $Tm^{3+}$ (thulium), $Ho^{3+}$ (holmium), or the like or any combination thereof. Confinement regions may be bounded by cladding having a lower index than the confinement region with fluorine or boron doping. Alternatively, VBC fiber 100 may comprise photonic crystal fibers or micro-structured fibers.

VBC fiber 100 is suitable for use in any of a variety of fiber, fiber optic, or fiber laser devices, including continuous wave and pulsed fiber lasers, disk lasers, solid state lasers, or diode lasers (pulse rate unlimited except by physical constraints). Furthermore, implementations in a planar waveguide or other types of waveguides and not just fibers are within the scope of the claimed technology.

Figure 2:
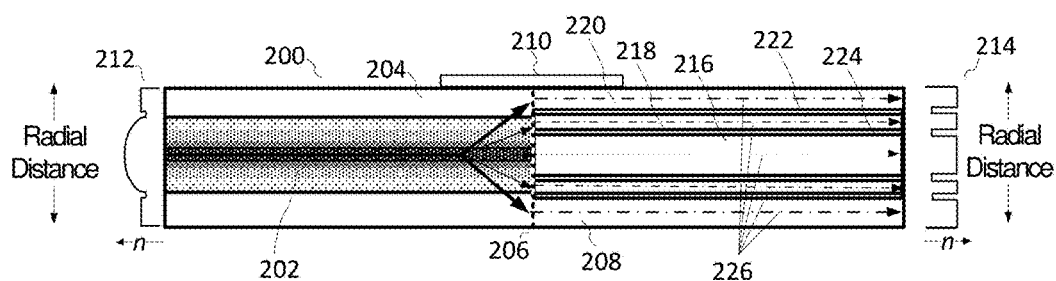
FIG. 2 depicts a cross-sectional view of an example fiber structure for delivering a beam with variable beam characteristics.

FIG. 2 depicts a cross-sectional view of an example VBC fiber 200 for adjusting beam characteristics of an optical beam. In an example, VBC fiber 200 may be a process fiber because it may deliver the beam to a process head for material processing. VBC fiber 200 comprises a first length of fiber 204 spliced at junction 206 to a second length of fiber 208. A perturbation assembly 210 is disposed proximal to junction 206. Perturbation assembly 210 may be any of a variety of devices configured to enable adjustment of the beam characteristics of an optical beam 202 propagating in VBC fiber 200. In an example, perturbation assembly 210 may be a mandrel and/or another device that may provide means of varying the bend radius and/or bend length of VBC fiber 200 near the splice. Other examples of perturbation devices are discussed below with respect to FIG. 24.

In an example, first length of fiber 204 has a parabolic-index RIP 212 as indicated by the left RIP graph. Most of the intensity distribution of beam 202 is concentrated in the center of fiber 204 when fiber 204 is straight or nearly straight. Second length of fiber 208 is a confinement fiber having RIP 214 as shown in the right RIP graph. Second length of fiber 208 includes confinement regions 216, 218 and 220. Confinement region 216 is a central core surrounded by two annular (or ring-shaped) confinement regions 218 and 220. Layers 222 and 224 are structural barriers of lower index material between confinement regions (216, 218 and 220), commonly referred to as "cladding" regions. In one example, layers 222 and 224 may comprise rings of fluorosilicate; in some embodiments, the fluorosilicate cladding layers are relatively thin. Other materials may be used as well and claimed subject matter is not limited in this regard.

In an example, as beam 202 propagates along VBC fiber 200, perturbation assembly 210 may physically act on fiber 208 and/or beam 202 to adjust its beam characteristics and generate adjusted beam 226. In the current example, the intensity distribution of beam 202 is modified by perturbation assembly 210. Subsequent to adjustment of beam 202 the intensity distribution of adjusted beam 226 may be concentrated in outer confinement regions 218 and 220 with relatively little intensity in the central confinement region 216. Because each of confinement regions 216, 218, and/or 220 is isolated by the thin layers of lower index material in barrier layers 222 and 224, second length of fiber 208 can substantially maintain the adjusted intensity distribution of adjusted beam 226. The beam will typically become distributed azimuthally within a given confinement region but will not transition (significantly) between the confinement regions as it propagates along the second length of fiber 208. Thus, the adjusted beam characteristics of adjusted beam 226 are largely conserved within the isolated confinement regions 216, 218, and/or 220. In some cases, it be may desirable to have the beam 226 power divided among the confinement regions 216, 218, and/or 220 rather than concentrated in a single region, and this condition may be achieved by generating an appropriately adjusted beam 226.

In one example, core confinement region 216 and annular confinement regions 218 and 220 may be composed of fused silica glass, and cladding 222 and 224 defining the confinement regions may be composed of fluorosilicate glass. Other materials may be used to form the various confinement regions (216, 218 and 220), including germanosilicate, phosphosilicate, aluminosilicate, or the like, or a combination thereof and claimed subject matter is not so limited. Other materials may be used to form the barrier rings (222 and 224), including fused silica, borosilicate, or the like or a combination thereof, and claimed subject matter is not so limited. In other embodiments, the optical fibers or waveguides include or are composed of various polymers or plastics or crystalline materials. Generally, the core confinement regions have refractive indices that are greater than the refractive indices of adjacent barrier/cladding regions.

In some examples, it may be desirable to increase a number of confinement regions in a second length of fiber to increase granularity of beam control over beam displacements for fine-tuning a beam profile. For example, confinement regions may be configured to provide stepwise beam displacement.

Figure 3:
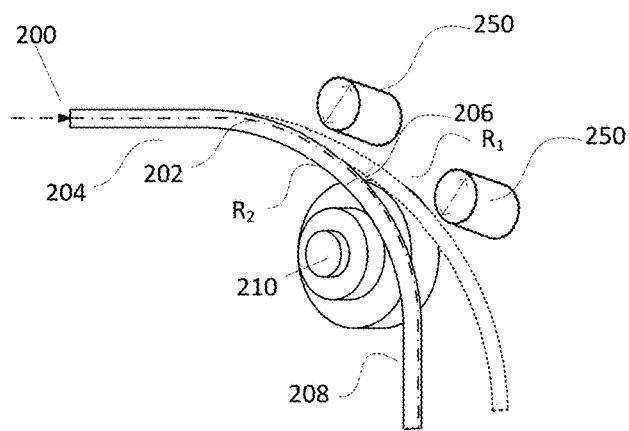
FIG. 3 illustrates an example method of perturbing a fiber structure for providing a beam having variable beam characteristics.

FIG. 3 illustrates an example method of perturbing fiber 200 for providing variable beam characteristics of an optical beam. Changing the bend radius of a fiber may change the radial beam position, divergence angle, and/or radiance profile of a beam within the fiber. The bend radius of VBC fiber 200 can be decreased from a first bend radius $R_1$ to a second bend radius $R_2$ about splice junction 206 by using a stepped mandrel or cone as the perturbation assembly 210. Additionally or alternatively, the engagement length on the mandrel(s) or cone can be varied. Rollers 250 may be employed to engage VBC fiber 200 across perturbation assembly 210. In an example, an amount of engagement of rollers 250 with fiber 200 has been shown to shift the distribution of the intensity profile to the outer confinement regions 218 and 220 of fiber 200 with a fixed mandrel radius. There are a variety of other methods for varying the bend radius of fiber 200, such as using a clamping assembly, flexible tubing, or the like, or a combination thereof, and claimed subject matter is not limited in this regard. In another example, for a particular bend radius the length over which VBC fiber 200 is bent can also vary beam characteristics in a controlled and reproducible way. In examples, changing the bend radius and/or length over which the fiber is bent at a particular bend radius also modifies the intensity distribution of the beam such that one or more modes may be shifted radially away from the center of a fiber core.

Maintaining the bend radius of the fibers across junction 206 ensures that the adjusted beam characteristics such as radial beam position and radiance profile of optical beam 202 will not return to beam 202's unperturbed state before being launched into second length of fiber 208. Moreover, the adjusted radial beam characteristics, including position, divergence angle, and/or intensity distribution, of adjusted beam 226 can be varied based on an extent of decrease in the bend radius and/or the extent of the bent length of VBC fiber 200. Thus, specific beam characteristics may be obtained using this method.

In the current example, first length of fiber 204 having first RIP 212 is spliced at junction 206 to a second length of fiber 208 having a second RIP 214. However, it is possible to use a single fiber having a single RIP formed to enable perturbation (e.g., by micro-bending) of the beam characteristics of beam 202 and also to enable conservation of the adjusted beam. Such a RIP may be similar to the RIPs shown in fibers illustrated in FIGS. 17, 18, and/or 19.

Figure 4:
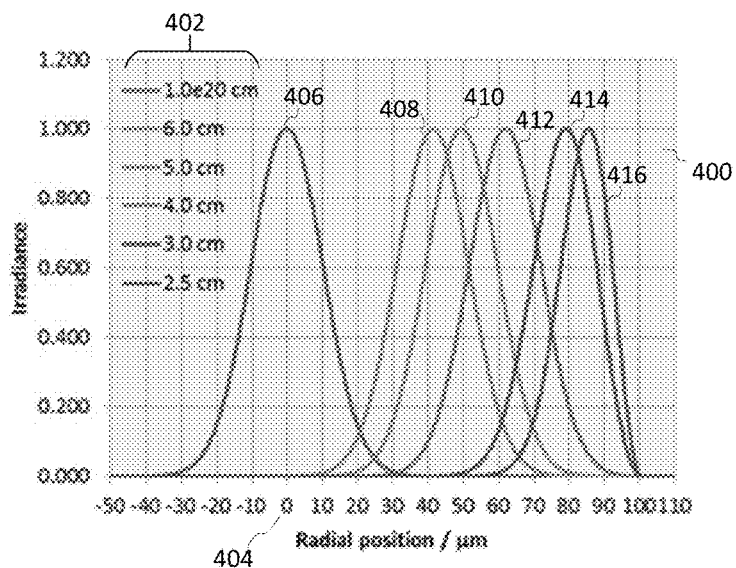
FIG. 4 is a graph illustrating the calculated spatial profile of the lowest-order mode ($LP_{01}$) for a first length of a fiber for different fiber bend radii.
Figure 5:
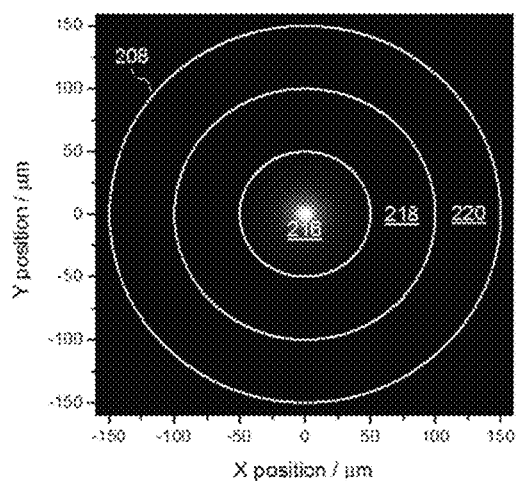
FIG. 5 illustrates an example of a two-dimensional intensity distribution at a junction when a fiber for varying beam characteristics is nearly straight.
Figure 6:
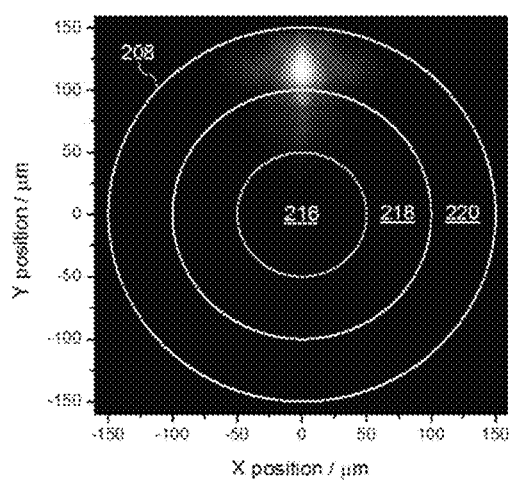
FIG. 6 illustrates an example of a two-dimensional intensity distribution at a junction when a fiber for varying beam characteristics is bent with a radius chosen to preferentially excite a particular confinement region of a second length of fiber.

FIGS. 7-10 provide experimental results for VBC fiber 200 (shown in FIGS. 2 and 3) and illustrate further a beam response to perturbation of VBC fiber 200 when a perturbation assembly 210 acts on VBC fiber 200 to bend the fiber. FIGS. 4-6 are simulations and FIGS. 7-10 are experimental results wherein a beam from a SM 1050 nm source was launched into an input fiber (not shown) with a 40 micron core diameter. The input fiber was spliced to first length of fiber 204.

FIG. 4 is an example graph 400 illustrating the calculated profile of the lowest-order mode ($LP_{01}$) for a first length of fiber 204 for different fiber bend radii 402, wherein a perturbation assembly 210 involves bending VBC fiber 200. As the fiber bend radius is decreased, an optical beam propagating in VBC fiber 200 is adjusted such that the mode shifts radially away from the center 404 of a VBC fiber 200 core (r=0 micron) toward the core/cladding interface (located at r=100 micron in this example). Higher-order modes ($LP_{In}$) also shift with bending. Thus, a straight or nearly straight fiber (very large bend radius), curve 406 for $LP_{01}$ is centered at or near the center of VBC fiber 200. At a bend radius of about 6 cm, curve 408 for $LP_{01}$ is shifted to a radial position of about 40 µm from the center 406 of VBC fiber 200. At a bend radius of about 5 cm, curve 410 for $LP_{01}$ is shifted to a radial position about 50 µm from the center 406 of VBC fiber 200. At a bend radius of about 4 cm, curve 412 for $LP_{01}$ is shifted to a radial position about 60 µm from the center 406 of VBC fiber 200. At a bend radius of about 3 cm, curve 414 for $LP_{01}$ is shifted to a radial position about 80 µm from the center 406 of VBC fiber 200. At a bend radius of about 2.5 cm, a curve 416 for $LP_{01}$ is shifted to a radial position about 85 µm from the center 406 of VBC fiber 200. Note that the shape of the mode remains relatively constant (until it approaches the edge of the core), which is a specific property of a parabolic RIP. Although, this property may be desirable in some situations, it is not required for the VBC functionality, and other RIPs may be employed.

In an example, if VBC fiber 200 is straightened, $LP_{01}$ mode will shift back toward the center of the fiber. Thus, the purpose of second length of fiber 208 is to "trap" or confine the adjusted intensity distribution of the beam in a confinement region that is displaced from the center of the VBC fiber 200. The splice between fibers 204 and 208 is included in the bent region, thus the shifted mode profile will be preferentially launched into one of the ring-shaped confinement regions 218 and 220 or be distributed among the confinement regions. FIGS. 5 and 6 illustrate this effect.

FIG. 5 illustrates an example two-dimensional intensity distribution at junction 206 within second length of fiber 208 when VBC fiber 200 is nearly straight. A significant portion of $LP_{01}$ and $LP_{In}$ are within confinement region 216 of fiber 208. FIG. 6 illustrates the two-dimensional intensity distribution at junction 206 within second length of fiber 208 when VBC fiber 200 is bent with a radius chosen to preferentially excite confinement region 220 (the outermost confinement region) of second length of fiber 208. A significant portion of $LP_{01}$ and $L_{In}$ are within confinement region 220 of fiber 208.

In an example, second length of fiber 208 confinement region 216 has a 100 micron diameter, confinement region 218 is between 120 micron and 200 micron in diameter, and confinement region 220 is between 220 micron and 300 micron diameter. Confinement regions 216, 218, and 220 are separated by 10 µm thick rings of fluorosilicate, providing an NA of 0.22 for the confinement regions. Other inner and outer diameters for the confinement regions, thicknesses of the rings separating the confinement regions, NA values for the confinement regions, and numbers of confinement regions may be employed.

Referring again to FIG. 5, with the noted parameters, when VBC fiber 200 is straight about 90% of the power is contained within the central confinement region 216, and about 100% of the power is contained within confinement regions 216 and 218. Referring now to FIG. 6, when fiber 200 is bent to preferentially excite second ring confinement region 220, nearly 75% of the power is contained within confinement region 220, and more than 95% of the power is contained within confinement regions 218 and 220. These calculations include $LP_{01}$ and two higher-order modes, which is typical in some 2-4 kW fiber lasers.

It is clear from FIGS. 5 and 6 that in the case where a perturbation assembly 210 acts on VBC fiber 200 to bend the fiber, the bend radius determines the spatial overlap of the modal intensity distribution of the first length of fiber 204 with the different guiding confinement regions (216, 218, and 220) of the second length of fiber 208. Changing the bend radius can thus change the intensity distribution at the output of the second length of fiber 208, thereby changing the diameter or spot size of the beam, and thus also changing its radiance and BPP value. This adjustment of the spot size may be accomplished in an all-fiber structure, involving no free-space optics and consequently may reduce or eliminate the disadvantages of free-space optics discussed above. Such adjustments can also be made with other perturbation assemblies that alter bend radius, bend length, fiber tension, temperature, or other perturbations discussed below.

In a typical materials processing system (e.g., a cutting or welding tool), the output of the process fiber is imaged at or near the work piece by the process head. Varying the intensity distribution as shown in FIGS. 5 and 6 thus enables variation of the beam profile at the work piece in order to tune and/or optimize the process, as desired. Specific RIPs for the two fibers were assumed for the purpose of the above calculations, but other RIPs are possible, and claimed subject matter is not limited in this regard.

FIGS. 7-10 depict experimental results (measured intensity distributions) to illustrate further output beams for various bend radii of VBC fiber 200 shown in FIG. 2.

Figure 7:
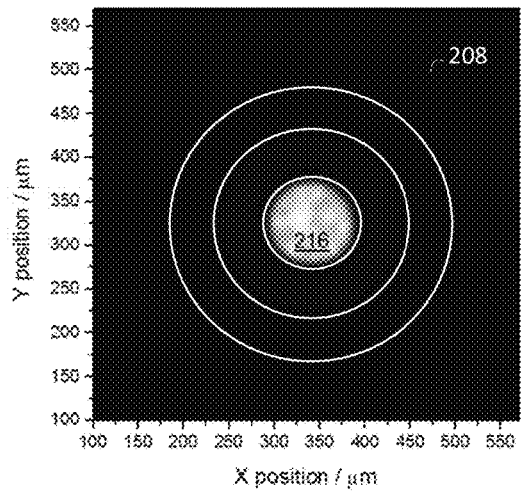
FIGS. 7-10 depict experimental results to illustrate further output beams for various bend radii of a fiber for varying beam characteristics shown in FIG. 2.
Figure 8:
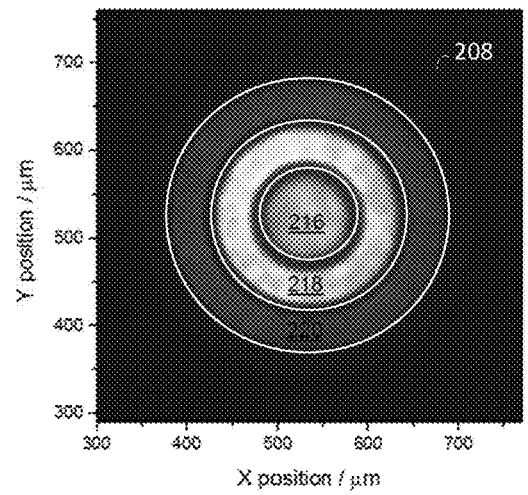
Figure 9:
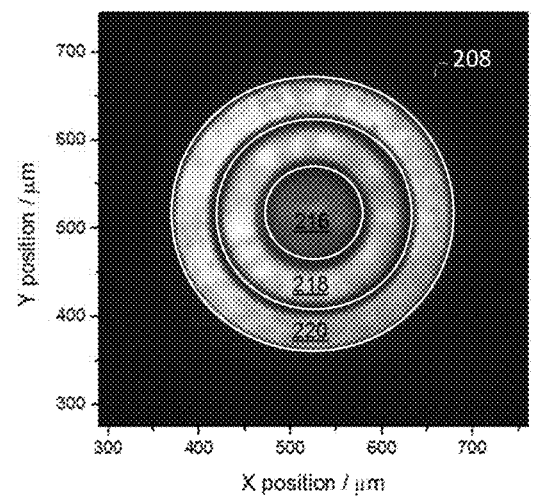
Figure 10:
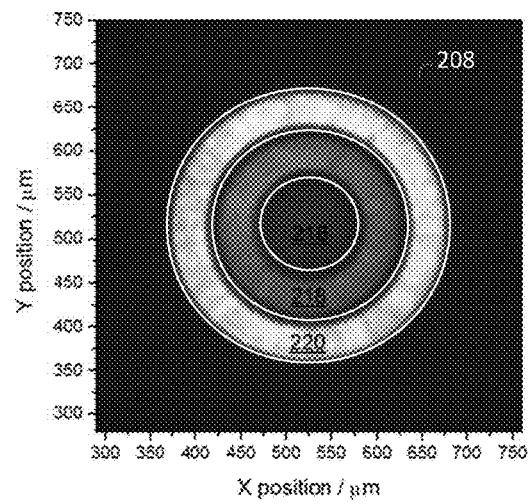

In FIG. 7 when VBC fiber 200 is straight, the beam is nearly completely confined to confinement region 216. As the bend radius is decreased, the intensity distribution shifts to higher diameters (FIGS. 8-10). FIG. 8 depicts the intensity distribution when the bend radius of VBC fiber 200 is chosen to shift the intensity distribution preferentially to confinement region 218. FIG. 9 depicts the experimental results when the bend radius is further reduced and chosen to shift the intensity distribution outward to confinement region 220 and confinement region 218. In FIG. 10, at the smallest bend radius, the beam is nearly a "donut mode", with most of the intensity in the outermost confinement region 220.

Despite excitation of the confinement regions from one side at the splice junction 206, the intensity distributions are nearly symmetric azimuthally because of scrambling within confinement regions as the beam propagates within the VBC fiber 200. Although the beam will typically scramble azimuthally as it propagates, various structures or perturbations (e.g., coils) could be included to facilitate this process.

For the fiber parameters used in the experiment shown in FIGS. 7-10, particular confinement regions were not exclusively excited because some intensity was present in multiple confinement regions. This feature may enable advantageous materials processing applications that are optimized by having a flatter or distributed beam intensity distribution. In applications requiring cleaner excitation of a given confinement region, different fiber RIPs could be employed to enable this feature.

The results shown in FIGS. 7-10 pertain to the particular fibers used in this experiment, and the details will vary depending on the specifics of the implementation. In particular, the spatial profile and divergence distribution of the output beam and their dependence on bend radius will depend on the specific RIPs employed, on the splice parameters, and on the characteristics of the laser source launched into the first fiber.

Different fiber parameters than those shown in FIG. 2 may be used and still be within the scope of the claimed subject matter. Specifically, different RIPs and core sizes and shapes may be used to facilitate compatibility with different input beam profiles and to enable different output beam characteristics. Example RIPs for the first length of fiber, in addition to the parabolic-index profile shown in FIG. 2, include other graded-index profiles, step-index, pedestal designs (i.e., nested cores with progressively lower refractive indices with increasing distance from the center of the fiber), and designs with nested cores with the same refractive index value but with various NA values for the central core and the surrounding rings. Example RIPs for the second length of fiber, in addition to the profile shown in FIG. 2, include confinement fibers with different numbers of confinement regions, non-uniform confinement-region thicknesses, different and/or non-uniform values for the thicknesses of the rings surrounding the confinement regions, different and/or non-uniform NA values for the confinement regions, different refractive-index values for the high-index and low-index portions of the RIP, non-circular confinement regions (such as elliptical, oval, polygonal, square, rectangular, or combinations thereof), as well as other designs as discussed in further detail with respect to FIGS. 26-28. Furthermore, VBC fiber 200 and other examples of a VBC fiber described herein are not restricted to use of two fibers. In some examples, implementation may include use of one fiber or more than two fibers. In some cases, the fiber(s) may not be axially uniform; for example, they could include fiber Bragg gratings or long-period gratings, or the diameter could vary along the length of the fiber. In addition, the fibers do not have to be azimuthally symmetric, e.g., the core(s) could have square or polygonal shapes. Various fiber coatings (buffers) may be employed, including high-index or index-matched coatings (which strip light at the glass-polymer interface) and low-index coatings (which guide light by total internal reflection at the glass-polymer interface). In some examples, multiple fiber coatings may be used on VBC fiber 200.

FIGS. 11-16 illustrate cross-sectional views of examples of first lengths of fiber for enabling adjustment of beam characteristics in a VBC fiber responsive to perturbation of an optical beam propagating in the first lengths of fiber. Some examples of beam characteristics that may be adjusted in the first length of fiber are: beam diameter, beam divergence distribution, BPP, intensity distribution, luminance, $M^2$ factor, NA, optical intensity profile, power density profile, radial beam position, radiance, spot size, or the like, or any combination thereof. The first lengths of fiber depicted in FIGS. 11-16 and described below are merely examples and do not provide an exhaustive recitation of the variety of first lengths of fiber that may be utilized to enable adjustment of beam characteristics in a VBC fiber assembly. Selection of materials, appropriate RIPs, and other variables for the first lengths of fiber illustrated in FIGS. 11-16 at least depend on a desired beam output. A wide variety of fiber variables are contemplated and are within the scope of the claimed subject matter. Thus, claimed subject matter is not limited by examples provided herein.

Figure 11:
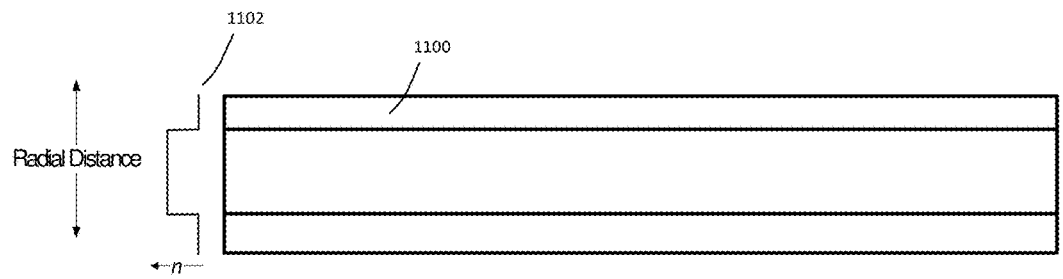
FIGS. 11-16 illustrate cross-sectional views of example first lengths of fiber for enabling adjustment of beam characteristics in a fiber assembly.
Figure 12:
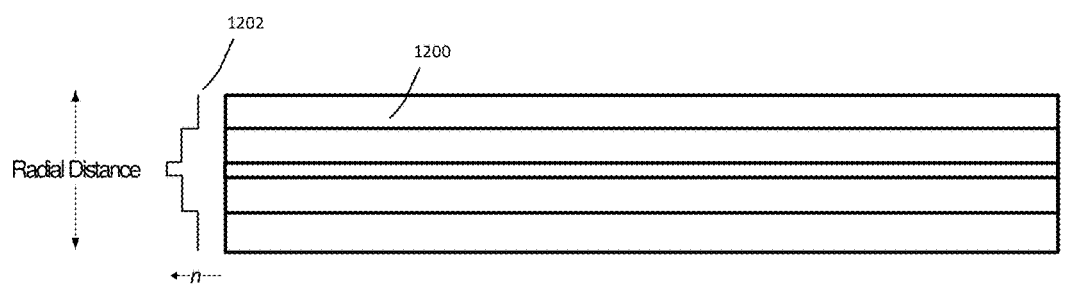
Figure 13:
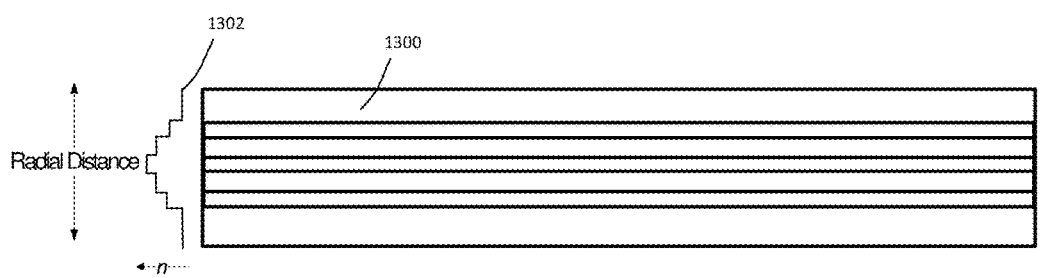

In FIG. 11 first length of fiber 1100 comprises a step-index profile 1102. FIG. 12 illustrates a first length of fiber 1200 comprising a "pedestal RIP" (i.e., a core comprising a step-index region surrounded by a larger step-index region) 1202. FIG. 13 illustrates first length of fiber 1300 comprising a multiple-pedestal RIP 1302.

Figure 14A:
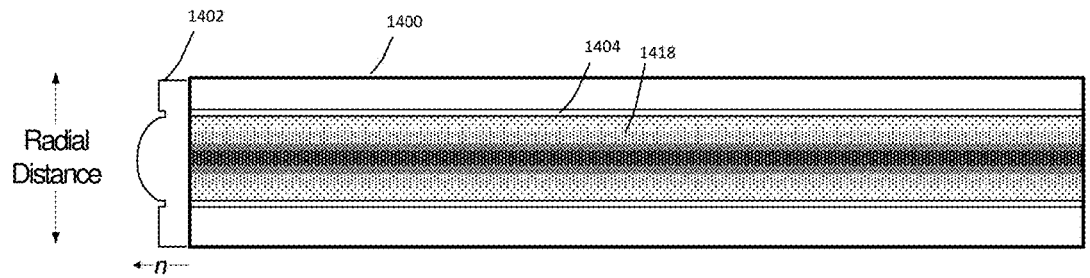

FIG. 14A illustrates first length of fiber 1400 comprising a graded-index profile 1418 surrounded by a down-doped region 1404. When the fiber 1400 is perturbed, modes may shift radially outward in fiber 1400 (e.g., during bending of fiber 1400). Graded-index profile 1402 may be designed to promote maintenance or even compression of modal shape. This design may promote adjustment of a beam propagating in fiber 1400 to generate a beam having a beam intensity distribution concentrated in an outer perimeter of the fiber (i.e., in a portion of the fiber core that is displaced from the fiber axis). As described above, when the adjusted beam is coupled into a second length of fiber having confinement regions, the intensity distribution of the adjusted beam may be trapped in the outermost confinement region, providing a donut shaped intensity distribution. A beam spot having a narrow outer confinement region may be useful to enable certain material processing actions.

Figure 14B:
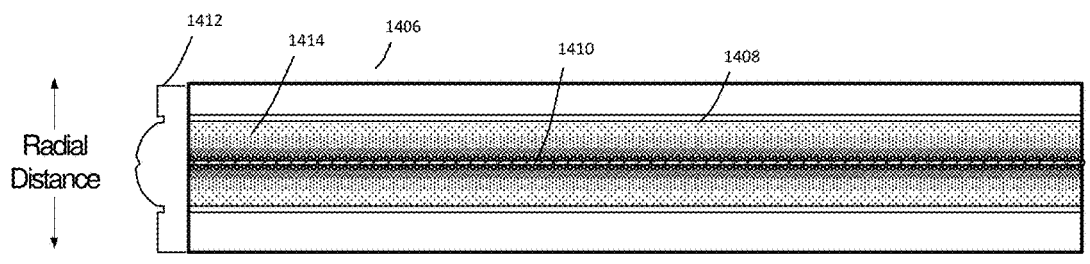

FIG. 14B illustrates first length of fiber 1406 comprising a graded-index profile 1414 surrounded by a down-doped region 1408 similar to fiber 1400. However, fiber 1406 includes a divergence structure 1410 (a lower-index region) as can be seen in profile 1412. The divergence structure 1410 is an area of material with a lower refractive index than that of the surrounding core. As the beam is launched into first length of fiber 1406, refraction from divergence structure 1410 causes the beam divergence to increase in first length of fiber 1406. The amount of increased divergence depends on the amount of spatial overlap of the beam with the divergence structure 1410 and the magnitude of the index difference between the divergence structure 1410 and the core material. Divergence structure 1410 can have a variety of shapes, depending on the input divergence distribution and desired output divergence distribution. In an example, divergence structure 1410 has a triangular or graded index shape.

Figure 15:
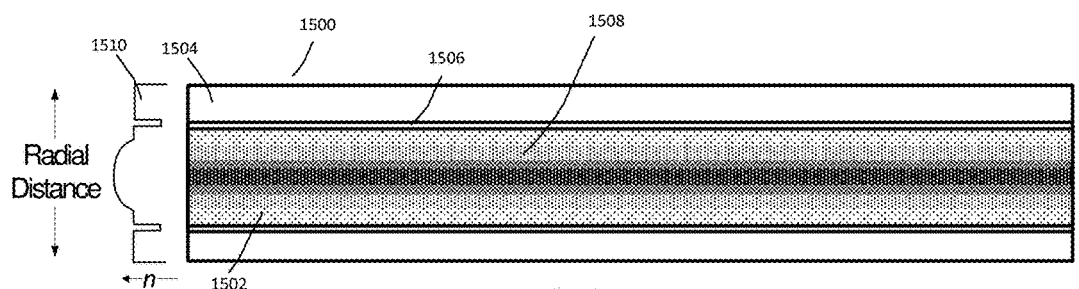

FIG. 15 illustrates a first length of fiber 1500 comprising a parabolic-index central region 1502 surrounded by a constant-index region 1504, and the constant-index region 1504 is surrounded by a lower-index annular layer 1506. The lower-index annulus 1506 helps guide a beam propagating in fiber 1500. When the propagating beam is perturbed, modes shift radially outward in fiber 1500 (e.g., during bending of fiber 1500). As one or more modes shift radially outward, parabolic-index region 1502 promotes retention of modal shape. When the modes reach the constant-index region of the RIP 1510, they will be compressed against the low-index ring 1506, which may cause preferential excitation of the outermost confinement region in the second fiber (in comparison to the first fiber RIP shown in FIG. 14). In one implementation, this fiber design works with a confinement fiber having a central step-index core and a single annular core. The parabolic-index portion 1502 of the RIP overlaps with the central step-index core of the confinement fiber. The constant-index portion 1504 overlaps with the annular core of the confinement fiber. The constant-index portion 1504 of the first fiber is intended to make it easier to move the beam into overlap with the annular core by bending. This fiber design also works with other designs of the confinement fiber.

Figure 16:
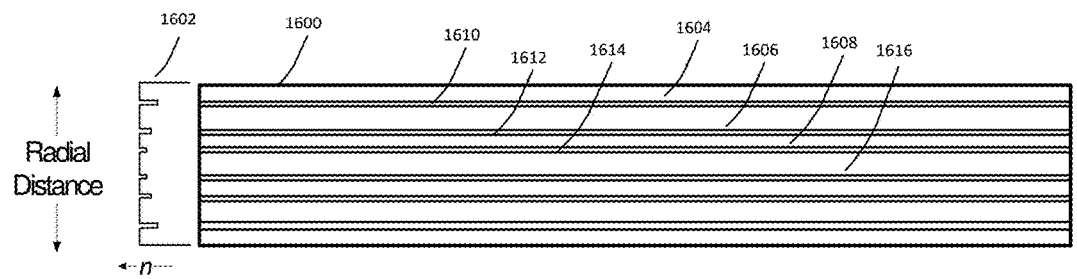

FIG. 16 illustrates a first length of fiber 1600 comprising guiding regions 1604, 1606, 1608, and 1616 bounded by lower-index layers 1610, 1612, and 1614 where the indexes of the lower-index layers 1610, 1612, and 1614 are stepped or, more generally, do not all have the same value. The stepped-index layers may serve to bound the beam intensity to certain guiding regions (1604, 1606, 1608, and 1616) when the perturbation assembly 210 (see FIG. 2) acts on the fiber 1600. In this way, adjusted beam light may be trapped in the guiding regions over a range of perturbation actions (such as over a range of bend radii, a range of bend lengths, a range of micro-bending pressures, and/or a range of acousto-optical signals), allowing for a certain degree of perturbation tolerance before a beam intensity distribution is shifted to a more distant radial position in fiber 1600. Thus, variation in beam characteristics may be controlled in a step-wise fashion. The radial widths of the guiding regions 1604, 1606, 1608, and 1616 may be adjusted to achieve a desired ring width, as may be required by an application. Also, a guiding region can have a thicker radial width to facilitate trapping of a larger fraction of the incoming beam profile if desired. Region 1606 is an example of such a design.

FIGS. 17-21 depict examples of fibers configured to enable maintenance and/or confinement of adjusted beam characteristics in the second length of fiber (e.g., fiber 208). These fiber designs are referred to as "ring-shaped confinement fibers" because they contain a central core surrounded by annular or ring-shaped cores. These designs are merely examples and not an exhaustive recitation of the variety of fiber RIPs that may be used to enable maintenance and/or confinement of adjusted beam characteristics within a fiber. Thus, claimed subject matter is not limited to the examples provided herein. Moreover, any of the first lengths of fiber described above with respect to FIGS. 11-16 may be combined with any of the second length of fiber described FIGS. 17-21.

Figure 17:
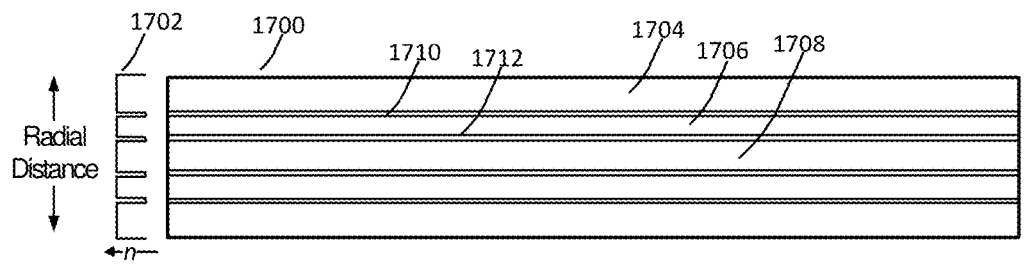
FIGS. 17-19 illustrate cross-sectional views of example second lengths of fiber ("confinement fibers") for confining adjusted beam characteristics in a fiber assembly.

FIG. 17 illustrates a cross-sectional view of an example second length of fiber for maintaining and/or confining adjusted beam characteristics in a VBC fiber assembly. As the perturbed beam is coupled from a first length of fiber to second length of fiber 1700, the second length of fiber 1700 may maintain at least a portion of the beam characteristics adjusted in response to perturbation in the first length of fiber within one or more of confinement regions 1704, 1706, and/or 1708. Fiber 1700 has a RIP 1702. Each of confinement regions 1704, 1706, and/or 1708 is bounded by a lower index layer 1710 and/or 1712. This design enables second length of fiber 1700 to maintain the adjusted beam characteristics. As a result, a beam output by fiber 1700 will substantially maintain the received adjusted beam as modified in the first length of fiber giving the output beam adjusted beam characteristics, which may be customized to a processing task or other application.

Figure 18:
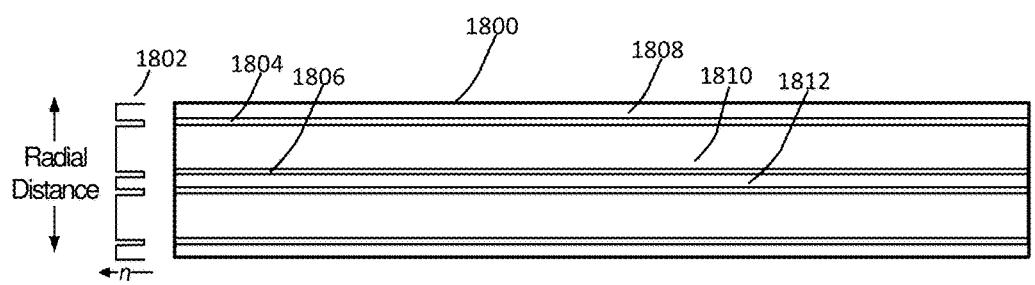

Similarly, FIG. 18 depicts a cross-sectional view of an example second length of fiber 1800 for maintaining and/or confining beam characteristics adjusted in response to perturbation in the first length of fiber in a VBC fiber assembly. Fiber 1800 has a RIP 1802. However, confinement regions 1808, 1810, and/or 1812 have different thicknesses than confinement regions 1704, 1706, and 1708. Each of confinement regions 1808, 1810, and/or 1812 is bounded by a lower index layer 1804 and/or 1806. Varying the thicknesses of the confinement regions (and/or barrier regions) enables tailoring or optimization of a confined adjusted radiance profile by selecting particular radial positions within which to confine an adjusted beam.

Figure 19:
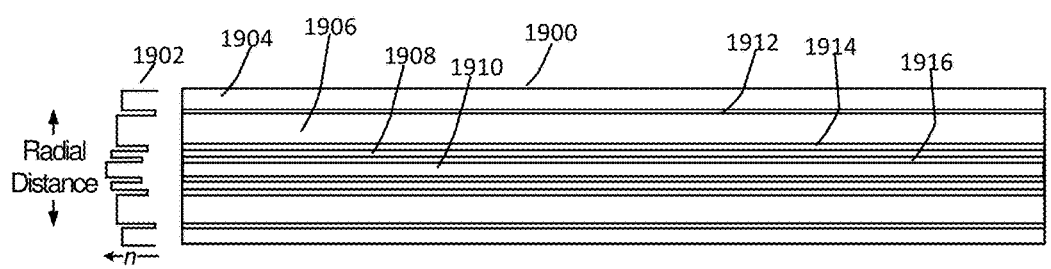

FIG. 19 depicts a cross-sectional view of an example second length of fiber 1900 having a RIP 1902 for maintaining and/or confining an adjusted beam in a VBC fiber assembly configured to provide variable beam characteristics. In this example, the number and thicknesses of confinement regions 1904, 1906, 1908, and 1910 are different from fiber 1700 and 1800 and the barrier layers 1912, 1914, and 1916 are of varied thicknesses as well. Furthermore, confinement regions 1904, 1906, 1908, and 1910 have different indexes of refraction and barrier layers 1912, 1914, and 1916 have different indexes of refraction as well. This design may further enable a more granular or optimized tailoring of the confinement and/or maintenance of an adjusted beam radiance to particular radial locations within fiber 1900. As the perturbed beam is launched from a first length of fiber to second length of fiber 1900 the modified beam characteristics of the beam (having an adjusted intensity distribution, radial position, and/or divergence angle, or the like, or a combination thereof) is confined within a specific radius by one or more of confinement regions 1904, 1906, 1908 and/or 1910 of second length of fiber 1900.

As noted previously, the divergence angle of a beam may be conserved or adjusted and then conserved in the second length of fiber. There are a variety of methods to change the divergence angle of a beam. The following are examples of fibers configured to enable adjustment of the divergence angle of a beam propagating from a first length of fiber to a second length of fiber in a fiber assembly for varying beam characteristics. However, these are merely examples and not an exhaustive recitation of the variety of methods that may be used to enable adjustment of divergence of a beam. Thus, claimed subject matter is not limited to the examples provided herein.

Figure 20:
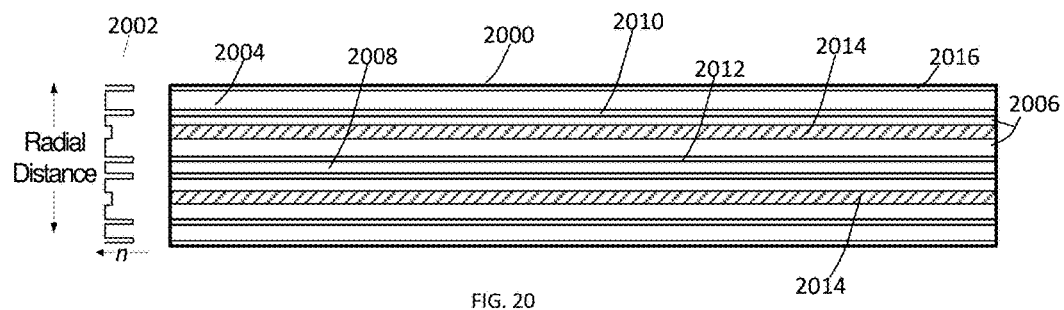
FIGS. 20 and 21 illustrate cross-sectional views of example second lengths of fiber for changing a divergence angle of and confining an adjusted beam in a fiber assembly configured to provide variable beam characteristics.

FIG. 20 depicts a cross-sectional view of an example second length of fiber 2000 having RIP 2002 for modifying, maintaining, and/or confining beam characteristics adjusted in response to perturbation in the first length of fiber. In this example, second length of fiber 2000 is similar to the previously described second lengths of fiber and forms a portion of the VBC fiber assembly for delivering variable beam characteristics as discussed above. There are three confinement regions 2004, 2006, and 2008 and three barrier layers 2010, 2012, and 2016. Second length of fiber 2000 also has a divergence structure 2014 situated within the confinement region 2006. The divergence structure 2014 is an area of material with a lower refractive index than that of the surrounding confinement region. As the beam is launched into second length of fiber 2000 refraction from divergence structure 2014 causes the beam divergence to increase in second length of fiber 2000. The amount of increased divergence depends on the amount of spatial overlap of the beam with the divergence structure 2014 and the magnitude of the index difference between the divergence structure 2014 and the core material. By adjusting the radial position of the beam near the launch point into the second length of fiber 2000, the divergence distribution may be varied. The adjusted divergence of the beam is conserved in fiber 2000, which is configured to deliver the adjusted beam to the process head, another optical system (e.g., fiber-to-fiber coupler or fiber-to-fiber switch), the work piece, or the like, or a combination thereof. In an example, divergence structure 2014 may have an index dip of about $10^{-5}$–$3 \times 10^{-2}$ with respect to the surrounding material. Other values of the index dip may be employed within the scope of this disclosure and claimed subject matter is not so limited.

Figure 21:
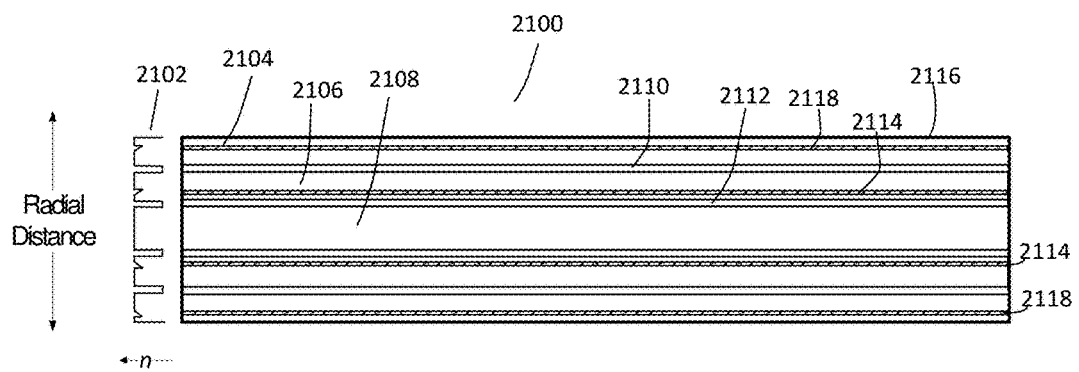

FIG. 21 depicts a cross-sectional view of an example second length of fiber 2100 having a RIP 2102 for modifying, maintaining, and/or confining beam characteristics adjusted in response to perturbation in the first length of fiber. Second length of fiber 2100 forms a portion of a VBC fiber assembly for delivering a beam having variable characteristics. In this example, there are three confinement regions 2104, 2106, and 2108 and three barrier layers 2110, 2112, and 2116. Second length of fiber 2100 also has a plurality of divergence structures 2114 and 2118. The divergence structures 2114 and 2118 are areas of graded lower index material. As the beam is launched from the first length fiber into second length of fiber 2100, refraction from divergence structures 2114 and 2118 causes the beam divergence to increase. The amount of increased divergence depends on the amount of spatial overlap of the beam with the divergence structure and the magnitude of the index difference between the divergence structure 2114 and/or 2118 and the surrounding core material of confinement regions 2106 and 2104 respectively. By adjusting the radial position of the beam near the launch point into the second length of fiber 2100, the divergence distribution may be varied. The design shown in FIG. 21 allows the intensity distribution and the divergence distribution to be varied somewhat independently by selecting both a particular confinement region and the divergence distribution within that conferment region (because each confinement region may include a divergence structure). The adjusted divergence of the beam is conserved in fiber 2100, which is configured to deliver the adjusted beam to the process head, another optical system, or the work piece. Forming the divergence structures 2114 and 2118 with a graded or non-constant index enables tuning of the divergence profile of the beam propagating in fiber 2100. An adjusted beam characteristic such as a radiance profile and/or divergence profile may be conserved as it is delivered to a process head by the second fiber. Alternatively, an adjusted beam characteristic such as a radiance profile and/or divergence profile may be conserved or further adjusted as it is routed by the second fiber through a fiber-to-fiber coupler (FFC) and/or fiber-to-fiber switch (FFS) and to a process fiber, which delivers the beam to the process head or the work piece.

Figure 26:
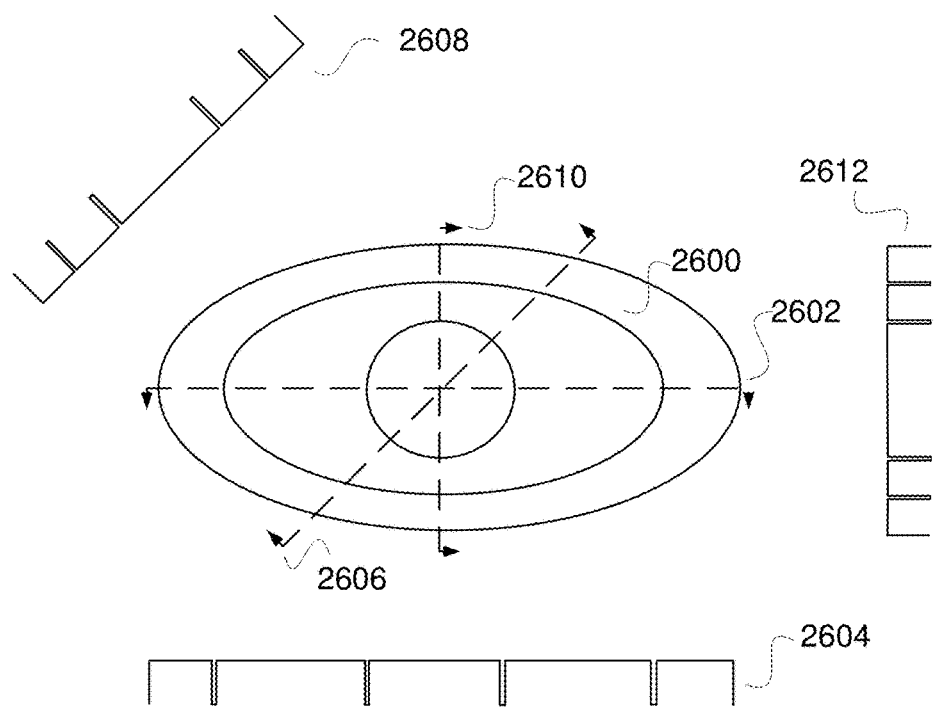
FIGS. 26-28 are cross-sectional views illustrating example second lengths of fiber ("confinement fibers") for confining adjusted beam characteristics in a fiber assembly.
Figure 27:
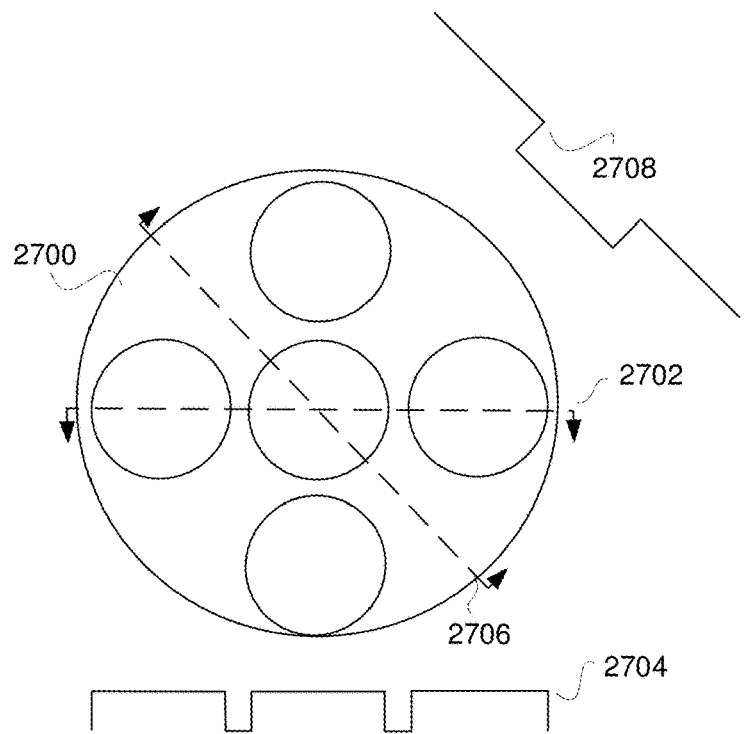
Figure 28:
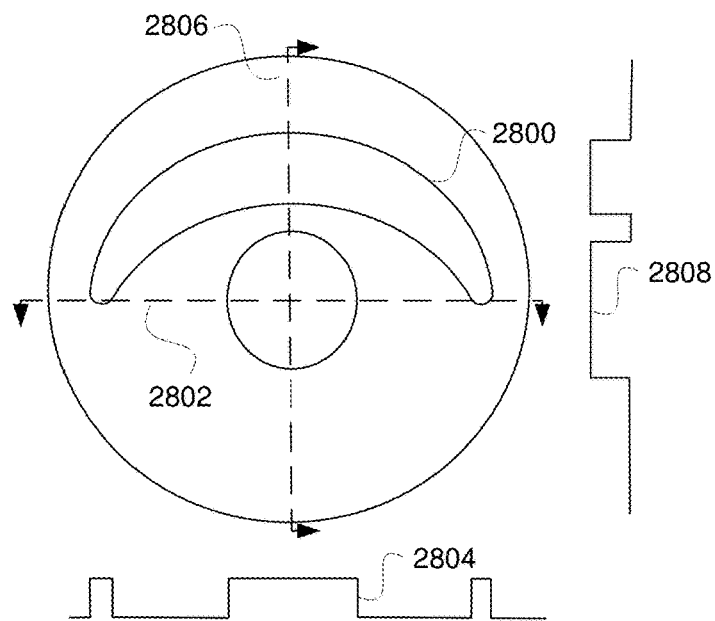

FIGS. 26-28 are cross-sectional views illustrating examples of fibers and fiber RIPs configured to enable maintenance and/or confinement of adjusted beam characteristics of a beam propagating in an azimuthally asymmetric second length of fiber wherein the beam characteristics are adjusted responsive to perturbation of a first length of fiber coupled to the second length of fiber and/or perturbation of the beam by a perturbation device 110. These azimuthally asymmetric designs are merely examples and are not an exhaustive recitation of the variety of fiber RIPs that may be used to enable maintenance and/or confinement of adjusted beam characteristics within an azimuthally asymmetric fiber. Thus, claimed subject matter is not limited to the examples provided herein. Moreover, any of a variety of first lengths of fiber (e.g., like those described above) may be combined with any azimuthally asymmetric second length of fiber (e.g., like those described in FIGS. 26-28).

FIG. 26 illustrates RIPs at various azimuthal angles of a cross-section through an elliptical fiber 2600. At a first azimuthal angle 2602, fiber 2600 has a first RIP 2604. At a second azimuthal angle 2606 that is rotated 45° from first azimuthal angle 2602, fiber 2600 has a second RIP 2608. At a third azimuthal angle 2610 that is rotated another 45° from second azimuthal angle 2606, fiber 2600 has a third RIP 2612. First, second and third RIPs 2604, 2608 and 2612 are all different.

FIG. 27 illustrates RIPs at various azimuthal angles of a cross-section through a multicore fiber 2700. At a first azimuthal angle 2702, fiber 2700 has a first RIP 2704. At a second azimuthal angle 2706, fiber 2700 has a second RIP 2708. First and second RIPs 2704 and 2708 are different. In an example, perturbation device 110 may act in multiple planes in order to launch the adjusted beam into different regions of an azimuthally asymmetric second fiber.

FIG. 28 illustrates RIPs at various azimuthal angles of a cross-section through a fiber 2800 having at least one crescent shaped core. In some cases, the corners of the crescent may be rounded, flattened, or otherwise shaped, which may minimize optical loss. At a first azimuthal angle 2802, fiber 2800 has a first RIP 2804. At a second azimuthal angle 2806, fiber 2800 has a second RIP 2808. First and second RIPs 2804 and 2808 are different.

Figure 22A:
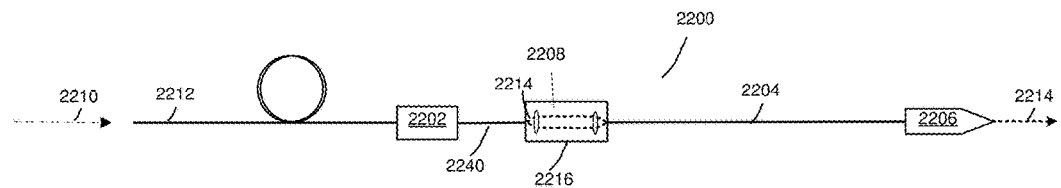
FIG. 22A illustrates an example laser system including a fiber assembly configured to provide variable beam characteristics disposed between a feeding fiber and process head.

FIG. 22A illustrates an example of a laser system 2200 including a VBC fiber assembly 2202 configured to provide variable beam characteristics. VBC fiber assembly 2202 comprises a first length of fiber 104, second length of fiber 108, and a perturbation device 110. VBC fiber assembly 2202 is disposed between feeding fiber 2212 (i.e., the output fiber from the laser source) and VBC delivery fiber 2240. VBC delivery fiber 2240 may comprise second length of fiber 108 or an extension of second length of fiber 108 that modifies, maintains, and/or confines adjusted beam characteristics. Beam 2210 is coupled into VBC fiber assembly 2202 via feeding fiber 2212. Fiber assembly 2202 is configured to vary the characteristics of beam 2210 in accordance with the various examples described above. The output of fiber assembly 2202 is adjusted beam 2214 which is coupled into VBC delivery fiber 2240. VBC delivery fiber 2240 delivers adjusted beam 2214 to free-space optics assembly 2208, which then couples beam 2214 into a process fiber 2204. Adjusted beam 2214 is then delivered to process head 2206 by process fiber 2204. The process head can include guided wave optics (such as fibers and fiber coupler), free space optics such as lenses, mirrors, optical filters, diffraction gratings), beam scan assemblies such as galvanometer scanners, polygonal mirror scanners, or other scanning systems that are used to shape the beam 2214 and deliver the shaped beam to a workpiece.

In laser system 2200, one or more of the free-space optics of assembly 2208 may be disposed in an FFC or other beam coupler 2216 to perform a variety of optical manipulations of an adjusted beam 2214 (represented in FIG. 22A with different dashing than beam 2210). For example, free-space optics assembly 2208 may preserve the adjusted beam characteristics of beam 2214. Process fiber 2204 may have the same RIP as VBC delivery fiber 2240. Thus, the adjusted beam characteristics of adjusted beam 2214 may be preserved all the way to process head 2206. Process fiber 2204 may comprise a RIP similar to any of the second lengths of fiber described above, including confinement regions.

Figure 22B:
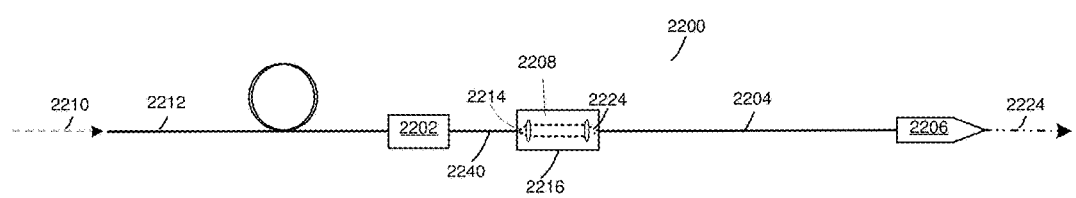
FIG. 22B illustrates an example a laser system including a fiber assembly configured to provide variable beam characteristics disposed between a feeding fiber and process head.

Alternatively, as illustrated in FIG. 22B, free-space optics assembly 2208 may change the adjusted beam characteristics of beam 2214 by, for example, increasing or decreasing the divergence and/or the spot size of beam 2214 (e.g., by magnifying or demagnifying beam 2214) and/or otherwise further modifying adjusted beam 2214. Furthermore, process fiber 2204 may have a different RIP than VBC delivery fiber 2240. Accordingly, the RIP of process fiber 2204 may be selected to preserve additional adjustment of adjusted beam 2214 made by the free-space optics of assembly 2208 to generate a twice adjusted beam 2224 (represented in FIG. 22B with different dashing than beam 2214).

Figure 23:
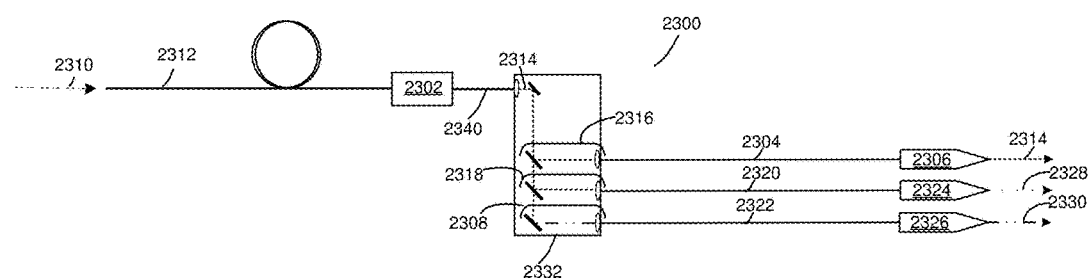
FIG. 23 illustrates an example laser system including a fiber assembly configured to provide variable beam characteristics disposed between a feeding fiber and multiple process fibers.

FIG. 23 illustrates an example of a laser system 2300 including VBC fiber assembly 2302 disposed between feeding fiber 2312 and VBC delivery fiber 2340. During operation, beam 2310 is coupled into VBC fiber assembly 2302 via feeding fiber 2312. Fiber assembly 2302 includes a first length of fiber 104, second length of fiber 108, and a perturbation device 110 and is configured to vary characteristics of beam 2310 in accordance with the various examples described above. Fiber assembly 2302 generates adjusted beam 2314 output by VBC delivery fiber 2340. VBC delivery fiber 2340 comprises a second length of fiber 108 of fiber for modifying, maintaining, and/or confining adjusted beam characteristics in a fiber assembly 2302 in accordance with the various examples described above (see FIGS. 17-21, for example). VBC delivery fiber 2340 couples adjusted beam 2314 into beam switch (FFS) 2332, which then couples its various output beams to one or more of multiple process fibers 2304, 2320, and 2322. Process fibers 2304, 2320, and 2322 deliver adjusted beams 2314, 2328, and 2330 to respective process heads 2306, 2324, and 2326.

In an example, beam switch 2332 includes one or more sets of free-space optics 2308, 2316, and 2318 configured to perform a variety of optical manipulations of adjusted beam 2314. Free-space optics 2308, 2316, and 2318 may preserve or vary adjusted beam characteristics of beam 2314. Thus, adjusted beam 2314 may be maintained by the free-space optics or adjusted further. Process fibers 2304, 2320, and 2322 may have the same or a different RIP as VBC delivery fiber 2340, depending on whether it is desirable to preserve or further modify a beam passing from the free-space optics assemblies 2308, 2316, and 2318 to respective process fibers 2304, 2320, and 2322. In other examples, one or more beam portions of beam 2310 are coupled to a workpiece without adjustment, or different beam portions are coupled to respective VBC fiber assemblies so that beam portions associated with a plurality of beam characteristics can be provided for simultaneous workpiece processing. Alternatively, beam 2310 can be switched to one or more of a set of VBC fiber assemblies.

Routing adjusted beam 2314 through any of free-space optics assemblies 2308, 2316, and 2318 enables delivery of a variety of additionally adjusted beams to process heads 2206, 2324, and 2326. Therefore, laser system 2300 provides additional degrees of freedom for varying the characteristics of a beam, as well as switching the beam between process heads ("time sharing") and/or delivering the beam to multiple process heads simultaneously ("power sharing").

For example, free-space optics in beam switch 2332 may direct adjusted beam 2314 to free-space optics assembly 2316 configured to preserve the adjusted characteristics of beam 2314. Process fiber 2304 may have the same RIP as VBC delivery fiber 2340. Thus, the beam delivered to process head 2306 will be a preserved adjusted beam 2314.

In another example, beam switch 2332 may direct adjusted beam 2314 to free-space optics assembly 2318 configured to preserve the adjusted characteristics of adjusted beam 2314. Process fiber 2320 may have a different RIP than VBC delivery fiber 2340 and may be configured with divergence altering structures as described with respect to FIGS. 20 and 21 to provide additional adjustments to the divergence distribution of beam 2314. Thus, the beam delivered to process head 2324 will be a twice adjusted beam 2328 having a different beam divergence profile than adjusted beam 2314.

Process fibers 2304, 2320, and/or 2322 may comprise a RIP similar to any of the second lengths of fiber described above, including confinement regions or a wide variety of other RIPs, and claimed subject matter is not limited in this regard.

In yet another example, free-space optics switch 2332 may direct adjusted beam 2314 to free-space optics assembly 2308 configured to change the beam characteristics of adjusted beam 2314. Process fiber 2322 may have a different RIP than VBC delivery fiber 2340 and may be configured to preserve (or alternatively further modify) the new further adjusted characteristics of beam 2314. Thus, the beam delivered to process head 2326 will be a twice adjusted beam 2330 having different beam characteristics (due to the adjusted divergence profile and/or intensity profile) than adjusted beam 2314.

In FIGS. 22A, 22B, and 23, the optics in the FFC or FFS may adjust the spatial profile and/or divergence profile by magnifying or demagnifying the beam 2214 before launching into the process fiber. They may also adjust the spatial profile and/or divergence profile via other optical transformations. They may also adjust the launch position into the process fiber. These methods may be used alone or in combination.

FIGS. 22A, 22B, and 23 merely provide examples of combinations of adjustments to beam characteristics using free-space optics and various combinations of fiber RIPs to preserve or modify adjusted beams 2214 and 2314. The examples provided above are not exhaustive and are meant for illustrative purposes only. Thus, claimed subject matter is not limited in this regard.

Figure 24:
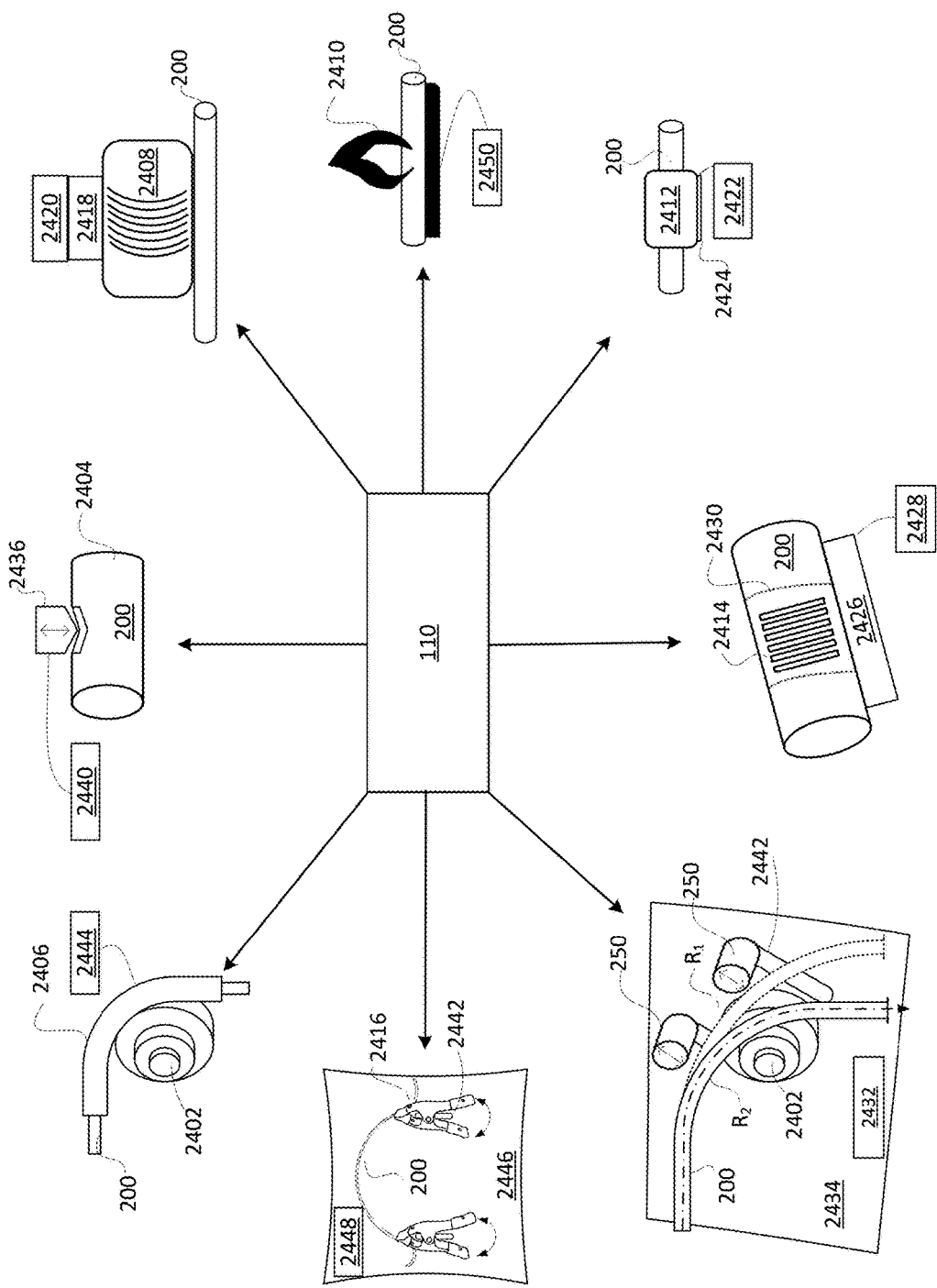
FIG. 24 illustrates examples of various perturbation assemblies for providing variable beam characteristics according to various examples provided herein.

FIG. 24 illustrates various examples of perturbation devices, assemblies or methods (for simplicity referred to collectively herein as "perturbation device 110") for perturbing a VBC fiber 200 and/or an optical beam propagating in VBC fiber 200 according to various examples provided herein. Perturbation device 110 may be any of a variety of devices, methods, and/or assemblies configured to enable adjustment of beam characteristics of a beam propagating in VBC fiber 200. In an example, perturbation device 110 may be a mandrel 2402, a micro-bend 2404 in the VBC fiber, flexible tubing 2406, an acousto-optic transducer 2408, a thermal device 2410, a piezo-electric device 2412, a grating 2414, a clamp 2416 (or other fastener), or the like, or any combination thereof. These are merely examples of perturbation devices 100 and not an exhaustive listing of perturbation devices 100 and claimed subject matter is not limited in this regard.

Mandrel 2402 may be used to perturb VBC fiber 200 by providing a form about which VBC fiber 200 may be bent. As discussed above, reducing the bend radius of VBC fiber 200 moves the intensity distribution of the beam radially outward. In some examples, mandrel 2402 may be stepped or conically shaped to provide discrete bend radii levels. Alternatively, mandrel 2402 may comprise a cone shape without steps to provide continuous bend radii for more granular control of the bend radius. The radius of curvature of mandrel 2402 may be constant (e.g., a cylindrical form) or non-constant (e.g., an oval-shaped form). Similarly, flexible tubing 2406, clamps 2416 (or other varieties of fasteners), or rollers 250 may be used to guide and control the bending of VBC fiber 200 about mandrel 2402. Furthermore, changing the length over which the fiber is bent at a particular bend radius also may modify the intensity distribution of the beam. VBC fiber 200 and mandrel 2402 may be configured to change the intensity distribution within the first fiber predictably (e.g., in proportion to the length over which the fiber is bent and/or the bend radius). Rollers 250 may move up and down along a track 2442 on platform 2434 to change the bend radius of VBC fiber 200.

Clamps 2416 (or other fasteners) may be used to guide and control the bending of VBC fiber 200 with or without a mandrel 2402. Clamps 2416 may move up and down along a track 2442 or platform 2446. Clamps 2416 may also swivel to change bend radius, tension, or direction of VBC fiber 200. Controller 2448 may control the movement of clamps 2416.

In another example, perturbation device 110 may be flexible tubing 2406 and may guide bending of VBC fiber 200 with or without a mandrel 2402. Flexible tubing 2406 may encase VBC fiber 200. Tubing 2406 may be made of a variety of materials and may be manipulated using piezo-electric transducers controlled by controller 2444. In another example, clamps or other fasteners may be used to move flexible tubing 2406.

Micro-bend 2404 in VBC fiber is a local perturbation caused by lateral mechanical stress on the fiber. Micro-bending can cause mode coupling and/or transitions from one confinement region to another confinement region within a fiber, resulting in varied beam characteristics of the beam propagating in a VBC fiber 200. Mechanical stress may be applied by an actuator 2436 that is controlled by controller 2440. However, this is merely an example of a method for inducing mechanical stress in fiber 200 and claimed subject matter is not limited in this regard.

Acousto-optic transducer (AOT) 2408 may be used to induce perturbation of a beam propagating in the VBC fiber using an acoustic wave. The perturbation is caused by the modification of the refractive index of the fiber by the oscillating mechanical pressure of an acoustic wave. The period and strength of the acoustic wave are related to the acoustic wave frequency and amplitude, allowing dynamic control of the acoustic perturbation. Thus, a perturbation assembly 110 including AOT 2408 may be configured to vary the beam characteristics of a beam propagating in the fiber. In an example, piezo-electric transducer 2418 may create the acoustic wave and may be controlled by controller or driver 2420. The acoustic wave induced in AOT 2408 may be modulated to change and/or control the beam characteristics of the optical beam in VBC 200 in real-time. However, this is merely an example of a method for creating and controlling an AOT 2408 and claimed subject matter is not limited in this regard.

Thermal device 2410 may be used to induce perturbation of a beam propagating in VBC fiber using heat. The perturbation is caused by the modification of the RIP of the fiber induced by heat. Perturbation may be dynamically controlled by controlling an amount of heat transferred to the fiber and the length over which the heat is applied. Thus, a perturbation assembly 110 including thermal device 2410 may be configured to vary a range of beam characteristics. Thermal device 2410 may be controlled by controller 2450.

Piezo-electric transducer 2412 may be used to induce perturbation of a beam propagating in a VBC fiber using piezoelectric action. The perturbation is caused by the modification of the RIP of the fiber induced by a piezoelectric material attached to the fiber. The piezoelectric material in the form of a jacket around the bare fiber may apply tension or compression to the fiber, modifying its refractive index via the resulting changes in density. Perturbation may be dynamically controlled by controlling a voltage to the piezo-electric device 2412. Thus, a perturbation assembly 110 including piezo-electric transducer 2412 may be configured to vary the beam characteristics over a particular range.

In an example, piezo-electric transducer 2412 may be configured to displace VBC fiber 200 in a variety of directions (e.g., axially, radially, and/or laterally) depending on a variety of factors, including how the piezo-electric transducer 2412 is attached to VBC fiber 200, the direction of the polarization of the piezo-electric materials, the applied voltage, etc. Additionally, bending of VBC fiber 200 is possible using the piezo-electric transducer 2412. For example, driving a length of piezo-electric material having multiple segments comprising opposing electrodes can cause a piezoelectric transducer 2412 to bend in a lateral direction. Voltage applied to piezoelectric transducer 2412 by electrode 2424 may be controlled by controller 2422 to control displacement of VBC fiber 200. Displacement may be modulated to change and/or control the beam characteristics of the optical beam in VBC 200 in real-time. However, this is merely an example of a method of controlling displacement of a VBC fiber 200 using a piezo-electric transducer 2412 and claimed subject matter is not limited in this regard.

Gratings 2414 may be used to induce perturbation of a beam propagating in a VBC fiber 200. A grating 2414 can be written into a fiber by inscribing a periodic variation of the refractive index into the core. Gratings 2414 such as fiber Bragg gratings can operate as optical filters or as reflectors. A long-period grating can induce transitions among co-propagating fiber modes. The radiance, intensity profile, and/or divergence profile of a beam comprised of one or more modes can thus be adjusted using a long-period grating to couple one or more of the original modes to one or more different modes having different radiance and/or divergence profiles. Adjustment is achieved by varying the periodicity or amplitude of the refractive index grating. Methods such as varying the temperature, bend radius, and/or length (e.g., stretching) of the fiber Bragg grating can be used for such adjustment. VBC fiber 200 having gratings 2414 may be coupled to stage 2426. Stage 2426 may be configured to execute any of a variety of functions and may be controlled by controller 2428. For example, stage 2426 may be coupled to VBC fiber 200 with fasteners 2430 and may be configured to stretch and/or bend VBC fiber 200 using fasteners 2430 for leverage. Stage 2426 may have an embedded thermal device and may change the temperature of VBC fiber 200.

Figure 25:
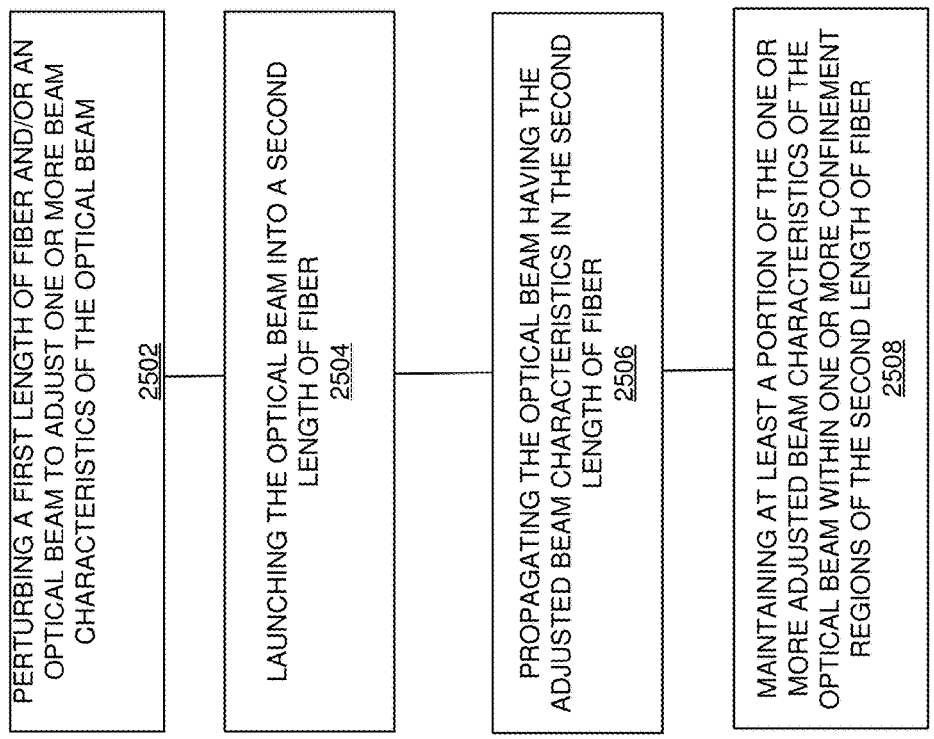
FIG. 25 illustrates an example process for adjusting and maintaining modified characteristics of an optical beam.

FIG. 25 illustrates an example process 2500 for adjusting and/or maintaining beam characteristics within a fiber without the use of free-space optics to adjust the beam characteristics. In block 2502, a first length of fiber and/or an optical beam are perturbed to adjust one or more optical beam characteristics. Process 2500 moves to block 2504, where the optical beam is launched into a second length of fiber. Process 2500 moves to block 2506, where the optical beam having the adjusted beam characteristics is propagated in the second length of fiber. Process 2500 moves to block 2508, where at least a portion of the one or more beam characteristics of the optical beam are maintained within one or more confinement regions of the second length of fiber. The first and second lengths of fiber may be comprised of the same fiber, or they may be different fibers.

Having described and illustrated the general and specific principles of examples of the presently disclosed technology, it should be apparent that the examples may be modified in arrangement and detail without departing from such principles. We claim all modifications and variation coming within the spirit and scope of the following claims.

We claim:

1. An optical beam delivery system, comprising:
an optical fiber including:
a first length of fiber comprising a first refractive index profile (RIP) formed to enable, at least in part, modification of one or more beam characteristics of an optical beam by a perturbation assembly arranged to modify the one or more beam characteristics, the perturbation assembly coupled to the first length of fiber or integral with the first length of fiber, or a combination thereof; and
a second length of fiber coupled to the first length of fiber and having a second RIP formed to preserve at least a portion of the one or more beam characteristics of the optical beam modified by the perturbation assembly within two or more cores wherein the first RIP and the second RIP are different; and
an optical system coupled to the second length of fiber including one or more free-space optics configured to receive and transmit an optical beam comprising the modified one or more beam characteristics.

2. The optical beam delivery system of claim 1, further comprising a first process fiber coupled between a first process head and the optical system, wherein the first process fiber is configured to receive the optical beam comprising the modified one or more beam characteristics.

3. The optical beam delivery system of claim 2, wherein the first process fiber comprises a third RIP configured to preserve at least a portion of the modified one or more beam characteristics of the optical beam within the two or more cores of the first process fiber.

4. The optical beam delivery system of claim 1, wherein at least a portion of the free-space optics are configured to further modify the modified one or more beam characteristics of the optical beam.

5. The optical beam delivery system of claim 1, wherein the one or more beam characteristics include beam diameter, divergence distribution, BPP, intensity distribution, luminance, $M^2$ value, NA, optical intensity, power density, radial beam position, radiance, or spot size, or any combination thereof.

6. The optical beam delivery system of claim 1, wherein the optical system is a fiber-to-fiber coupler, a fiber-to-fiber switch or a process head, or a combination thereof.

7. An optical beam delivery system, comprising:
an optical fiber including:
a first length of fiber comprising a first refractive index profile (RIP) formed to enable, at least in part, modification of one or more beam characteristics of an optical beam by a perturbation assembly arranged to modify the one or more beam characteristics, the perturbation assembly coupled to the first length of fiber or integral with the first length of fiber, or a combination thereof; and
a second length of fiber coupled to the first length of fiber and having a second RIP formed to preserve at least a portion of the one or more beam characteristics of the optical beam modified by the perturbation assembly within one or more first confinement regions wherein the first RIP and the second RIP are different;
an optical system coupled to the second length of fiber including one or more free-space optics configured to receive and transmit an optical beam comprising the modified one or more beam characteristics; and
a first process fiber coupled between a first process head and the optical system, wherein the first process fiber is configured to receive the optical beam comprising the modified one or more beam characteristics, wherein the first process fiber comprises a third RIP configured to preserve at least a portion of the modified one or more beam characteristics of the optical beam within one or more second confinement regions of the first process fiber.

8. The optical beam delivery system of claim 7, wherein the third RIP is the same as the second RIP.

9. The optical beam delivery system of claim 7, wherein the third RIP is different from the second RIP, wherein the third RIP is configured to further modify the modified one or more beam characteristics of the optical beam.

10. The optical beam delivery system of claim 9, wherein at least one of the one or more second confinement regions includes at least one divergence structure configured to modify a divergence profile of the optical beam.

11. The optical beam delivery system of claim 10, wherein the at least one divergence structure comprises an area of lower-index material than that of the second confinement region.

12. The optical beam delivery system of claim 7, further comprising a second process fiber having a fourth RIP that is coupled between the optical system and a second process head, wherein the second process fiber is configured to receive the optical beam comprising the modified one or more beam characteristics within one or more third confinement regions of the second process fiber.

13. The optical beam delivery system of claim 12, wherein the first process fiber or the second process fiber or a combination thereof is configured to further modify the modified one or more beam characteristics of the optical beam.

14. The optical beam delivery system of claim 12, wherein the second process fiber includes at least one divergence structure configured to modify a divergence profile of the optical beam.

15. The optical beam delivery system of claim 14, wherein the second process fiber comprises a central core surrounded by at least one of the one or more third confinement regions, wherein the central core and at least one third confinement region are separated by a cladding structure having a first refractive index that is lower than a second refractive index of the central core and a third refractive index of the at least one third confinement region, wherein the at least one third confinement region includes the at least one divergence structure.

16. The optical beam delivery system of claim 15, wherein the at least one divergence structure comprises an area of lower-index material than that of the third confinement region.

17. The optical beam delivery system of claim 12, wherein the second RIP is different from the third RIP or the fourth RIP or a combination thereof.

18. The optical beam delivery system of claim 12, wherein the second RIP is the same as the third RIP or the fourth RIP or a combination thereof.

19. The optical beam delivery system of claim 12, wherein the one or more beam characteristics include beam diameter, divergence distribution, BPP, intensity distribution, luminance, $M^2$ value, NA, optical intensity, power density, radial beam position, radiance, or spot size, or any combination thereof.

20. The optical beam delivery system of claim 12, wherein at least a portion of the free-space optics are configured to further modify the modified one or more beam characteristics of the optical beam.

21. The optical beam delivery system of claim 20, further comprising a first process fiber coupled between a first process head and the optical system, wherein the first process fiber is configured to receive the optical beam comprising twice modified one or more beam characteristics.

22. The optical beam delivery system of claim 21, wherein the first process fiber has a third RIP configured to preserve at least a portion of the twice modified one or more beam characteristics of the optical beam within one or more second confinement regions of the first process fiber.

23. The optical beam delivery system of claim 21, wherein the third RIP is different from the second RIP, wherein the third RIP is configured to further modify the twice modified one or more beam characteristics of the optical beam.

24. The optical beam delivery system of claim 21, wherein the first process fiber includes a divergence structure configured to further modify the twice modified one or more beam characteristics of the optical beam.

25. The optical beam delivery system of claim 21, further comprising a second process fiber coupled between the optical system and a second process head, wherein the second process fiber is configured to receive the twice modified one or more beam characteristics.

26. The optical beam delivery system of claim 25, wherein the first process fiber or the second process fiber or a combination thereof is configured to further modify the twice modified one or more beam characteristics of the optical beam.

27. The optical beam delivery system of claim 25, wherein the first process fiber or the second process fiber or a combination thereof includes at least one divergence structure configured to further modify the twice modified one or more beam characteristics of the optical beam.

* * * * *